United States Patent
Lee et al.

(10) Patent No.: US 11,647,338 B2
(45) Date of Patent: May 9, 2023

(54) FLEXIBLE PIEZOELECTRIC ACOUSTIC SENSOR FABRICATED INTEGRALLY WITH SI AS THE SUPPORTING SUBSTRATE, VOICE SENSOR USING THIN FILM POLYMER AND VOICE SENSOR WITH DIFFERENT THICKNESS AND VOICE SENSING METHOD USING SAME

(71) Applicants: KOREA ADVANCED INSTITUTE OF SCIENCE AND TECHNOLOGY, Daejeon (KR); FRONICS INC., Daejeon (KR)

(72) Inventors: Keonjae Lee, Daejoen (KR); Young Hoon Jung, Daejeon (KR); Jae Hyun Han, Daejeon (KR); Hee Seung Wang, Daejeon (KR); Mingi Chung, Daejeon (KR)

(73) Assignees: KOREA ADVANCED INSTITUTE OF SCIENCE AND TECHNOLOGY, Daejeon (KR); FRONICS INC., Daejeon (KR)

( * ) Notice: Subject to any disclaimer, the term of this patent is extended or adjusted under 35 U.S.C. 154(b) by 0 days.

(21) Appl. No.: 17/347,415

(22) Filed: Jun. 14, 2021

(65) Prior Publication Data

US 2021/0409871 A1 Dec. 30, 2021

(30) Foreign Application Priority Data

Jun. 30, 2020 (KR) .................. 10-2020-0080524
Jun. 30, 2020 (KR) .................. 10-2020-0080533
Jun. 30, 2020 (KR) .................. 10-2020-0080551

(51) Int. Cl.
*H04R 17/02* (2006.01)
*H10N 30/88* (2023.01)
(Continued)

(52) U.S. Cl.
CPC ......... *H04R 17/02* (2013.01); *H01L 41/0533* (2013.01); *H01L 41/0973* (2013.01);
(Continued)

(58) Field of Classification Search
None
See application file for complete search history.

(56) References Cited

U.S. PATENT DOCUMENTS

| 2007/0284971 A1* | 12/2007 | Sano | H01L 41/0477 310/364 |
| 2010/0327702 A1* | 12/2010 | Martin | H01L 41/081 29/25.35 |
| 2021/0021936 A1* | 1/2021 | Hui | H04R 1/04 |

FOREIGN PATENT DOCUMENTS

| KR | 10-1994-0006950 | 7/1994 |
| KR | 10-2012-0099026 | 9/2012 |

(Continued)

OTHER PUBLICATIONS

Office Action dated Nov. 18, 2021 corresponding to Korean Patent Application No. 10-2020-0080524, 6 pages.

(Continued)

*Primary Examiner* — Kenny H Truong

(57) ABSTRACT

Provided is a voice sensor comprising a piezoelectric material layer includes a substrate, a support layer, a metal layer, a piezoelectric material layer on the metal layer and an electrode on the piezoelectric material layer, and the substrate integrally supports a device layer of the voice sensor by exposing a part of a thin film including the piezoelectric material layer, the electrode and a polymer layer.

16 Claims, 37 Drawing Sheets

(51) Int. Cl.
  *H10N 30/20*    (2023.01)
  *H10N 30/853*   (2023.01)
  *H10N 30/078*   (2023.01)
  *H04R 3/04*     (2006.01)
  *H04R 1/04*     (2006.01)
  *H04R 17/00*    (2006.01)
  *H04R 7/04*     (2006.01)
  *H03F 3/183*    (2006.01)
  *H01L 41/053*   (2006.01)
  *H01L 41/09*    (2006.01)
  *H01L 41/187*   (2006.01)
  *H01L 41/318*   (2013.01)

(52) U.S. Cl.
  CPC ........ *H01L 41/1876* (2013.01); *H01L 41/318* (2013.01); *H03F 3/183* (2013.01); *H04R 1/04* (2013.01); *H04R 3/04* (2013.01); *H04R 7/04* (2013.01); *H04R 17/005* (2013.01); *H03F 2200/03* (2013.01); *H04R 2307/025* (2013.01); *H04R 2440/01* (2013.01)

(56) References Cited

FOREIGN PATENT DOCUMENTS

| KR | 10-2014-0105825 | 9/2014 |
| KR | 10-1619898 | 5/2016 |
| KR | 10-2016-0144655 | 12/2016 |
| KR | 10-1718214 | 3/2017 |
| WO | WO 2011-046714 | 4/2011 |

OTHER PUBLICATIONS

Office Action dated Nov. 23, 2021 corresponding to Korean Patent Application No. 10-2020-0080533, 6 pages.

Office Action dated Nov. 18, 2021 corresponding to Korean Patent Application No. 10-2020-0080551, 4 pages.

Hyun Soo Lee et al., "Flexible Inorganic Piezoelectric Acoustic Nanosensors for Biomimetic Artificial Hair Cells", *Advanced Functional Materials*, 2014, vol. 24, No. 44, 6914-6921.

* cited by examiner

Average thickness of gradient PI sample and PI substrate having uniform thickness of 25 μm

FLEXIBLE PIEZOELECTRIC ACOUSTIC SENSOR FABRICATED INTEGRALLY WITH SI AS THE SUPPORTING SUBSTRATE, VOICE SENSOR USING THIN FILM POLYMER AND VOICE SENSOR WITH DIFFERENT THICKNESS AND VOICE SENSING METHOD USING SAME

CROSS-REFERENCE TO RELATED APPLICATION

This application claims priority of Korean Patent Application No. 10-2020-0080524, filed on Jun. 30, 2020, priority of Korean Patent Application No. 10-2020-0080533, filed on Jun. 30, 2020, and priority of Korean Patent Application No. 10-2020-0080551, filed on Jun. 30, 2020, in the KIPO (Korean Intellectual Property Office), the disclosure of which is incorporated herein entirely by reference.

BACKGROUND OF THE INVENTION

Field of the Invention

The present disclosure relates to a flexible piezoelectric voice recognition sensor comprising a piezoelectric material layer, and more particularly, to an ultra-low power voice recognition sensor for removing the problem with large scale transfer and properties homogeneity between devices by removing the backside of a supporting substrate on which a piezoelectric thin film is deposited through a Deep Reactive-ion etching (DRIE) process, only leaving the thin film in a specific thickness range, without needing to transfer the piezoelectric thin film from a motherboard to a flexible substrate when fabricating a flexible piezoelectric acoustic sensor.

Additionally, the present disclosure relates to a voice sensor using a thin film polymer, and more particularly, to a voice sensor using a thin film polymer with wider resonance frequency bandwidth and significantly improved sensitivity.

Additionally, the present disclosure relates to a voice sensor having different thickness and a voice sensing method using the same, and more particularly, to a voice sensor with improved sensitivity and wide frequency ranges by varying the thickness depending on the frequency range, and a voice sensing method using the same.

Description of the Related Art

A voice recognition sensor refers to a sensor that extracts and recognizes linguistic information from acoustic information included in human voice and makes a response thereto. In these days where easy and convenient Natural user interfaces (UI) are available, voice conversation is regarded as the most natural and convenient method among the information exchange media between humans and machines in the future Internet of Things (IoT) era. However, for voice communication between humans and machines, it is necessary to convert human voice into a machine-processable format, and this process is voice recognition.

Voice recognition represented by Apple Siri is configured as a combination of microphone, Analog to Digital Converter (ADC) and Digital Signal Processing (DSP), and an always-active mode for use in mobile applications requires high power consumption, so it is manipulated by pressing a start stop button. This is one of the biggest obstacles to realizing true voice recognition-based IoT, and it is expected that development of ultra-low power always-on voice recognition systems will open a wide range of IoT applications.

The voice recognition systems that can be easily used without separate learning or training are a promising technology that will lead the future industry in the IoT era with the growing demand for UI development and construction for innovative next-generation IT products, and they make information input feasible when hands are busy or while moving, and achieve quick or real-time information processing due to the faster input than typing.

Recently, evolution of smart phone terminal performance, development of artificial intelligence and knowledge search technology and batch data processing through cloud-based voice recognition systems make it possible to find a desired answer accurately and quickly as an intelligent agent, but despite these advantages and possibilities, voice recognition technology still has the following limitations.

First, from the perspective of hardware, the existing voice recognition technology using a combination of microphone, ADC and DSP requires very high-power consumption, so always-on voice recognition is realistically impossible without a separate charger, and moreover, the use in voice recognition sensors for mobile applications is very restrictive due to the energy problem. Additionally, a preliminary operation of pressing the voice recognition start button is necessary, and the accuracy, reliability and speed are low. That is, for use in smartphones, TVs, vehicles and wearable devices based on IoT, high sensitivity is essential, and it is necessary to achieve voice recognition with ultra-low power by keeping always active without high power consumption even in a sleep mode.

Next, from the perspective of acoustics and linguistics, the existing voice recognition using a combination of microphone, ADC and DSP is based on a complex algorithm, and thus has a limitation to recognizing a natural conversational tone.

A capacitive microphone sensor that is the most widely used voice recognition sensor includes two conductive plates. When sound spreads in air, the plates vibrate, causing a change in capacitance, then the change is sensed, and the sound is converted into an electrical signal. The capacitive microphone sensor has a very high resonance frequency of the device beyond the audible frequency range to prevent the plates from greatly vibrating in response to sound in a specific frequency, and thus fails to greatly amplify the vibrations of the plates to the sound, resulting in low sensitivity of the sensor. Additionally, the sensor always needs power supply, causing the waste of the battery.

In contrast, the human cochlea efficiently performs signal processing through a simple algorithm after frequency separation of complex speech. Despite many devices using the principle of the cochlea, there are earlier applications for cochlear implants that mimic the human cochlear, but there is no previous attempt to use as ultra-low power voice recognition sensors for IoT.

Flexible piezoelectric thin film cochlear implant applications are found in Hyun Soo Lee et al.'s research paper in Advanced Functional Materials Vol. 24, No. 44, pages 6914-6921, 2014. Three piezoelectric devices are attached to a trapezoidal thin silicon membrane to separate a voice signal in the audible frequency range according to the frequency. The paper reports frequency separation using each of the three piezoelectric devices attached to the silicon membrane and the use in cochlear implants, but does not consider the algorithm and circuit design as ultra-low power voice sensors for IoT.

Additionally, Korean Patent Publication No. 10-2012-0099036, published on Sep. 6, 2012, proposes a piezoelectric device for outputting a haptic feedback effect using a plurality of resonance frequencies. This literature provides haptic feedback technology based on touch, force and motion, but does not disclose recognizing voice by separating the recognized voice into a plurality of frequencies.

Meanwhile, Applicant's Korean Patent No. 10-1718214 manufactures a plurality of frequency separation channels having a trapezoidal shape and different length using a flexible piezoelectric thin film, and in this process, performs large scale transfer of the piezoelectric thin film, and thus this procedural problem places a limitation on the mass-production of homogeneous devices.

Currently, in the fabrication of flexible piezoelectric acoustic sensors, it is necessary to transfer a piezoelectric thin film from a motherboard to a flexible substrate. To make the piezoelectric thin film, thermal treatment is required, but since a flexible substrate such as a plastic substrate cannot withstand high temperature, it is necessary to form on a motherboard and move to a flexible substrate through a transfer process.

SUMMARY OF THE INVENTION

The present disclosure is designed to solve the large scale transfer problem, and therefore the present disclosure is directed to providing a flexible piezoelectric acoustic sensor integrally fabricated by removing the backside of a supporting substrate on which a piezoelectric thin film is deposited through Deep Reactive-ion etching (DRIE) process, only leaving the thin film in a specific thickness range, without needing to transfer the piezoelectric thin film from a motherboard to a flexible substrate when fabricating the flexible piezoelectric acoustic sensor, and a voice sensing method using the same.

The present disclosure is further directed to providing a new ultrathin film polymer-based flexible piezoelectric acoustic sensor having high sensitivity in a small size, and a voice sensing method using the same.

The present disclosure is further directed to providing a new flexible piezoelectric device-based voice sensor having high sensitivity in the wide frequency range, and a voice sensing method using the same.

To solve the above-described problem, a voice sensor comprising a piezoelectric material layer according to an aspect of the present disclosure includes a substrate, a piezoelectric material layer, an electrode and a polymer layer positioned above or below the piezoelectric material layer, and preferably, a unit channel may be defined as a combination of the piezoelectric material layer and the electrode, a plurality of unit channels may be arranged and separated, and may support the voice sensor by exposing a part of the substrate.

Preferably, the voice sensor may be integrally fabricated by exposing a part of a thin film including the piezoelectric material layer, the electrode and the polymer layer using a back etching process through a Bosch process, such that the part of the substrate supports the thin film.

Preferably, at least one of the electrodes, the polymer layer or the exposed sensor area negative piezoelectric layer may have a circular or polygonal shape.

Preferably, the exposed thin film may have a width of 0.1 cm to 2 cm.

Preferably, a modulus of the polymer layer may range from 0.1 to 50 GPa.

Preferably, the modulus of the polymer layer may be different continuously or discontinuously in a direction within a same layer.

Preferably, the unit channels may be different in at least one of width or length.

Preferably, the unit channels may be different in length, and the length may reduce continuously or discontinuously in a direction.

Preferably, the substrate may include an oxide layer, and the oxide layer may prevent damage of the exposed thin film.

Preferably, the oxide layer may act as an etch stop layer when a thickness is controlled by etching the substrate by an etching method.

A method for fabricating a flexible piezoelectric voice recognition sensor according to another aspect of the present disclosure includes forming a substrate having an etch stop layer to a predetermined thickness, depositing a piezoelectric material layer, stacking an electrode on or below the piezoelectric material layer, forming a polymer layer on or below the piezoelectric material layer, and removing a backside of the substrate through a Deep Reactive-ion etching (DRIE) process, thereby eliminating a transfer process of the piezoelectric material layer.

Meanwhile, a voice sensor according to another aspect of the present disclosure includes an inorganic-based piezoelectric material layer, a polymer and an electrode for detecting an electrical signal from the piezoelectric material layer, and preferably, a unit channel may be defined as a combination of the piezoelectric material layer and the electrode, a plurality of unit channels may be arranged and separated, and a thickness of the polymer may range between 0.1 and 30 of a thickness of the piezoelectric material layer.

Preferably, a modulus of the polymer may range from 0.1 to 100 GPa.

Preferably, the unit channel or the exposed thin film may be different in at least one of width or length.

Preferably, the unit channel or the exposed thin film may be different in length, and the length may reduce continuously or discontinuously in a direction.

Preferably, processing of the electrical signal for sound sensed in the unit channel may include amplifying through an analog circuit for each frequency, filtering and converting to a digital signal, and a frequency range sensed through the unit channel may be from 0.1 to 10 kHz.

Preferably, the length of the unit channel may range from 1.0 mm to 10.0 mm.

Meanwhile, a voice sensor according to still another aspect of the present disclosure includes an inorganic-based piezoelectric material layer, a polymer, and an electrode for detecting an electrical signal from the piezoelectric material layer, and preferably, a unit channel may be defined as a combination of the piezoelectric material layer and the electrode, a plurality of unit channels may be arranged and separated, and at least two of the plurality of unit channels may be different in sum of thicknesses of the piezoelectric material layer and the polymer.

Preferably, the thickness of the voice sensor may be different with respect to a center of the unit channel electrode.

Preferably, the voice sensor may include a piezoelectric material layer, an electrode and a polymer positioned above or below, and the polymer layer of the voice sensor channel may be different in thickness, and accordingly at least two of the plurality of unit channels may be different in thickness.

Preferably, the voice sensor may include a piezoelectric material layer, an electrode, a polymer positioned above or below and a passivation layer, and at least one of the substrates, the piezoelectric material layer, the electrode or the passivation layer may be different in thickness, and accordingly, at least two of the plurality of unit channels may be different in thickness.

Preferably, the unit channel electrode may be different in at least one of width or length, and at least two of width, length or thickness of the unit channel electrode may be different depending on a frequency range of sound to be sensed.

Preferably, the unit channel electrode may be different in length and thickness.

Preferably, a region having the different thickness of the voice sensor may change continuously in the thickness of the voice sensor.

Preferably, a region having the different thickness of the voice sensor may change stepwise in the thickness of the voice sensor.

Preferably, processing of sound sensed in the unit channel may include amplifying through an analogue circuit for each frequency, filtering and converting to a digital signal, and a resonance frequency range sensed through the unit channel may be from 0.1 to 10 kHz.

Preferably, the plurality of frequency separation channels may range from 5.0 mm to 22.2 mm in length.

Preferably, an ultra-miniature voice sensor system for mobile application using voice recognition-based Internet of Things (IoT) according to another aspect of the present disclosure includes the voice sensor.

Preferably, a ubiquitous device according to another aspect of the present disclosure includes the voice sensor.

Preferably, a wearable electronic device according to another aspect of the present disclosure includes the voice sensor.

The present disclosure removes the large-scale transfer problem by removing the backside of a substrate on which a piezoelectric thin film is deposited through a Deep Reactive-ion etching (DRIE) process, only leaving the thin film in a specific thickness range without needing to transfer the piezoelectric thin film from a motherboard to a flexible substrate when fabricating a flexible piezoelectric acoustic sensor. Additionally, it is possible to achieve the mass-production of an integrated device using Si as a supporting substrate and realize a voice sensor in which the properties between the fabricated devices are homogenous.

The voice sensor according to the present disclosure uses a thin film polymer having a predetermined range relative to a piezoelectric material layer. As a result, it is possible to expand the resonance frequency bandwidth detected in one unit channel, resulting in the wide frequency bandwidth through the voice sensor and improved sensitivity. Additionally, the use of the thin film polymer reduces the total area of the voice sensor, thereby achieving an ultra-miniature voice sensor.

The flexible piezoelectric voice recognition sensor having a non-uniform substrate thickness according to the present disclosure can sense the wide frequency range using thin channels sensing low frequency and thick channels for sensing high frequency by adopting a structure in which the thickness of the flexible piezoelectric voice recognition sensor changes in various manners.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
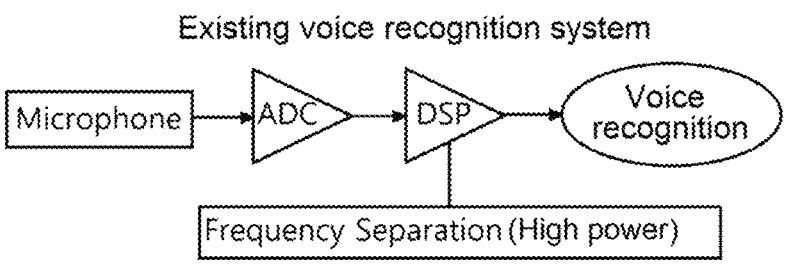
FIG. 1 is a comparison diagram showing a difference between a voice recognition system according to the related art and the present disclosure.
Figure 1:
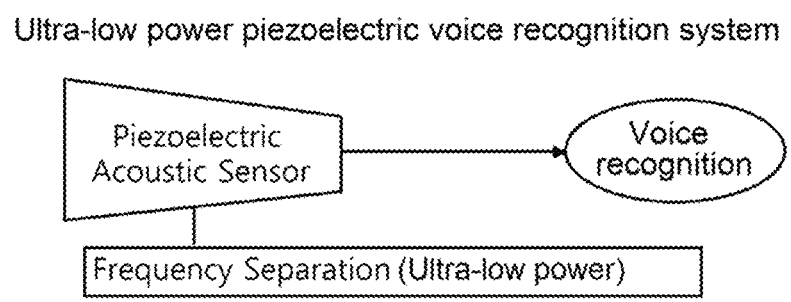

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

FIG. 1 is a comparison diagram showing a difference between a voice recognition system according to the related art and the present disclosure. In FIG. 1, the existing voice recognition system receives a micro voice signal in an analog form, converts it into a digital signal through an analog to digital converter (ADC) and performs signal processing of the digital signal through a digital signal processing (DSP) for frequency separation, and in this instance, power consumption is high.

In contrast, an ultra-low power voice recognition sensor of the present disclosure is a piezoelectric sensor and achieves real-time voice recognition with ultra-low power. The frequency separation process that has been performed through the microphone, ADC and DSP can be performed by only one piezoelectric voice recognition sensor. That is, first, a voice signal is separated by a plurality of electrode channels according to the frequency, and at the same time, a mechanical movement is converted into an electrical signal by a piezoelectric device based on a thin film and the electrical signal is detected in each frequency range.

That is, the existing microphone uses a frequency band filter, ADC and DSP and thus requires high power consumption, but the present disclosure uses a plurality of piezoelectric devices that produces an electric current separately for each frequency, thereby reducing the power spent by the band filter, ADC or DSP. Additionally, it is possible to reduce the power spent in extracting the frequency.

Figure 2:
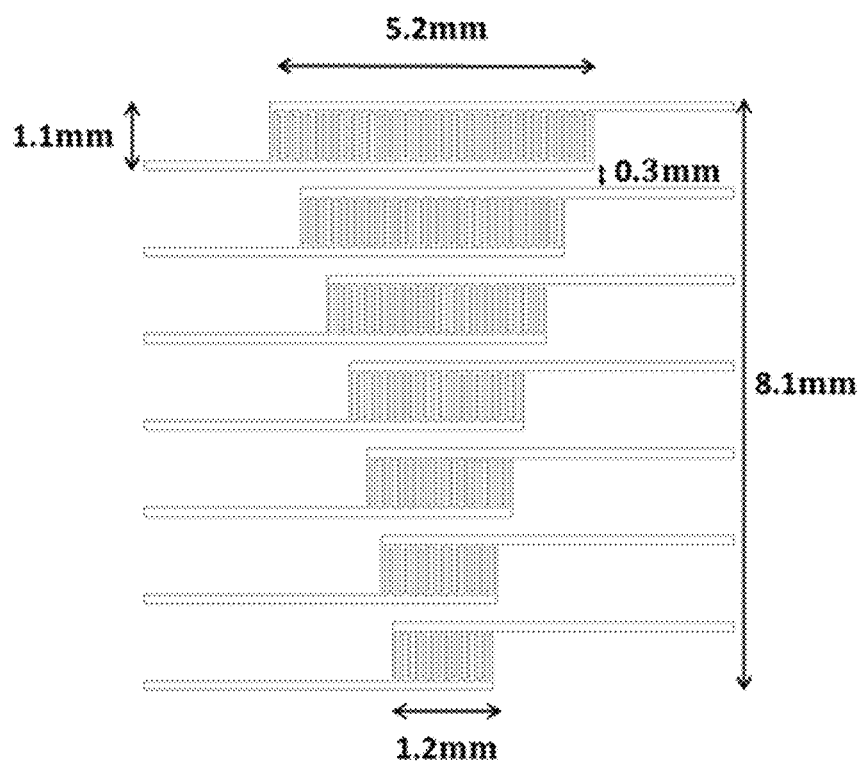
FIG. 2 is a plane view of channels of a voice sensor according to an embodiment of the present disclosure.

FIG. 2 is a plane view of the channels of the voice sensor according to an embodiment of the present disclosure. Referring to FIG. 2, it can be seen that the voice sensor according to an embodiment of the present disclosure includes a plurality of unit channels having different lengths for each sensing target frequency range. In an embodiment of the present disclosure, the lengths of the plurality of unit channels are at the level of 1.2 mm to 5.2 mm, but the scope of the present disclosure is not limited thereto.

Figure 3:
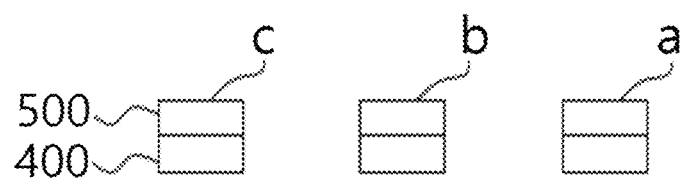
FIGS. 3 and 4 are a cross-sectional view and a plane view of a voice sensor according to an embodiment of the present disclosure.
Figure 4:
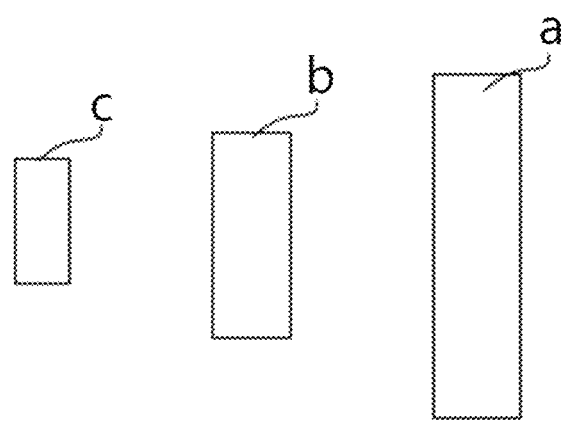

FIGS. 3 and 4 is a cross-sectional view and a plane view of the voice sensor according to an embodiment of the present disclosure. The voice sensor according to an embodiment of the present disclosure includes a piezoelectric material layer and an electrode for detecting an electrical signal from the piezoelectric material layer, a combination of the piezoelectric material layer and the electrode is defined as a unit channel, and a plurality of unit channels a, b, c is arranged in line and separated from each other.

The present disclosure provides a voice sensor fabricated on a substrate without a separate transfer process and a method for fabricating the same. To this end, device layers are stacked on the substrate, and for the thickness control of the substrate, a part of the device layers is exposed by selectively etching the substrate area.

Figure 5:
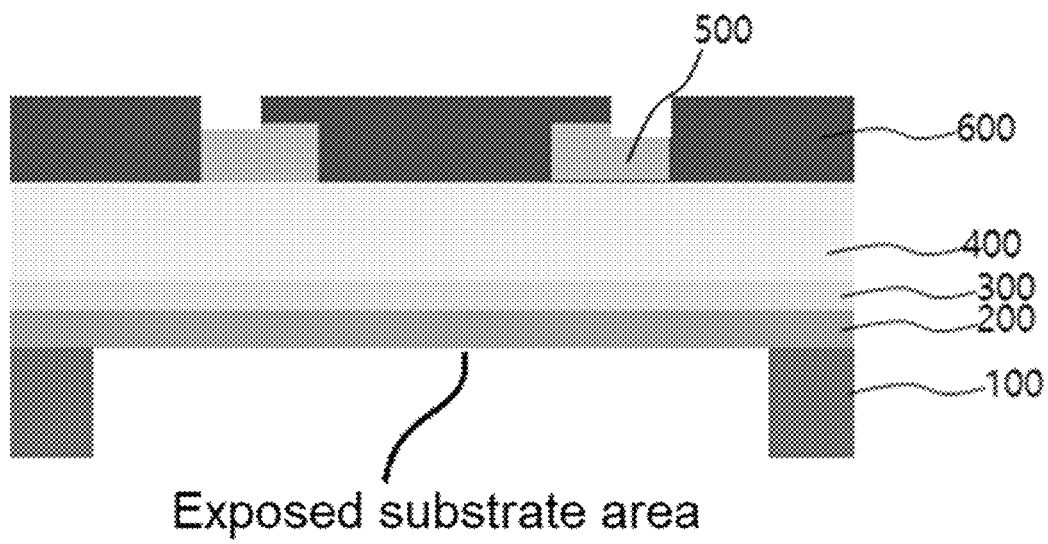
FIGS. 5 to 12 are process diagrams illustrating each step of a method for fabricating a piezoelectric voice recognition sensor according to an embodiment of the present disclosure.

FIG. 5 is a cross-sectional view of the voice sensor according to an embodiment of the present disclosure. The voice sensor is integrally fabricated by exposing the thin film using etching such that a part of the substrate supports the thin film. FIG. 5 shows an example of the final structure of the voice sensor, and the voice sensor is integrally fabricated by exposing a part of the thin film using a back etching process through a Bosch process such that a part of the substrate supports the thin film.

Referring to FIG. 5, the substrate according to the present disclosure is etched in part by a back etching method so that an active area including the piezoelectric material layer on the substrate is exposed, and accordingly, the substrate supports the device layer apart from the substrate. That is, in FIG. 5, the voice sensor includes a substrate 100, an oxide layer 200 stacked on the substrate 100, a metal layer 300 stacked on the oxide layer 200, a piezoelectric material layer 400 on the metal layer, an electrode 500 on the piezoelectric material layer, and a polymer layer 600 that covers the electrode 500.

The substrate 100 supports the device layer of the voice sensor by exposing a part of the thin film (the active area) including the piezoelectric material layer 400, the electrode 500 and the polymer layer 600 by etching of the substrate. In the present disclosure, the device layer includes all the material layers stacked on the substrate, and the present disclosure provides a structure that supports the device layer stacked on the substrate by exposing a part of the device layer.

In an embodiment of the present disclosure, after the piezoelectric material layer 400 and the electrode 500 are stacked on the substrate 100, a part of the device layer is exposed through thickness control and the exposed part including the electrode, the polymer layer and the piezoelectric material layer has a circular or polygonal shape, but the scope of the present disclosure is not limited thereto.

In an embodiment of the present disclosure, the width of the exposed thin film ranges from 0.1 cm to 2 cm, and the oxide layer 200 of FIG. 5 exposed by etching the substrate 100 prevents the damage of the thin film and acts as an etch stop layer.

FIGS. 6 to 12 are cross-sectional views illustrating each step of a method for fabricating the piezoelectric voice recognition sensor according to an embodiment of the present disclosure.

Figure 6:
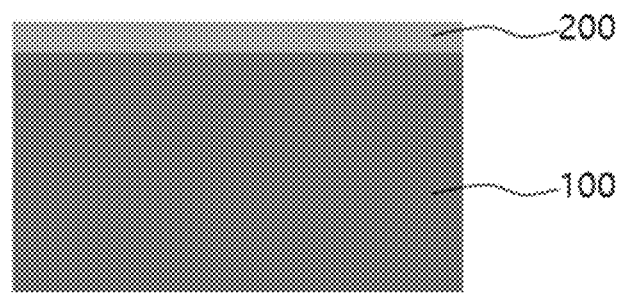

Referring to FIG. 6, the silicon substrate 100 is formed with the thickness of about 650 μm.

The oxide layer 200 is deposited on the silicon substrate 100 to the thickness of 1 μm for use as an etch stop layer. The oxide layer 200 uses $SiO_2$.

Figure 7:
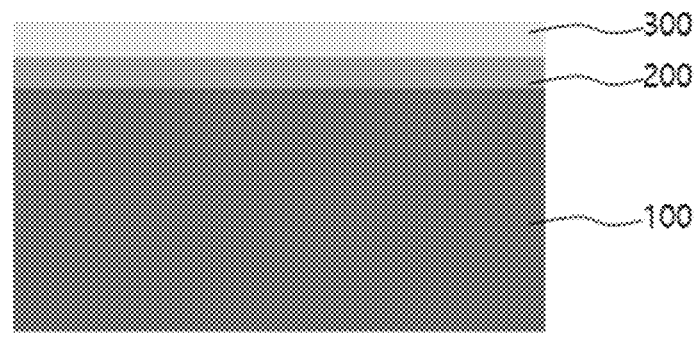

Referring to FIG. 7, for a PZT film similar to a sapphire-based process, the metal layer 300 is deposited on the oxide layer 200 to the thickness of about 0.1 μm to allow PZT deposition in a desired crystallographic orientation. The metal layer 300 is formed as a Pt/Ti layer.

Figure 8:
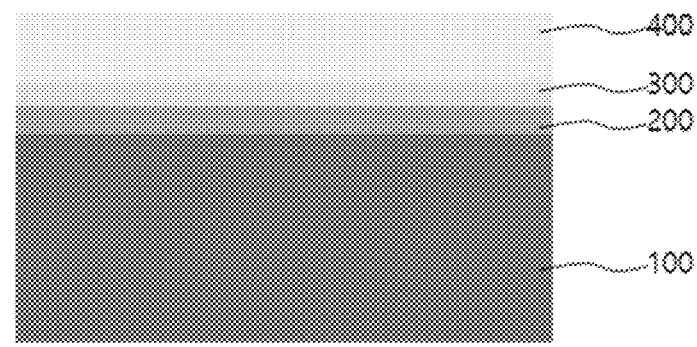

Referring to FIG. 8, the piezoelectric material layer 400 is deposited on the metal layer 300 through the well-known sol-gel process. To remove organics from the sol-gel solution thin film, 0.4 M PZT sol-gel solution (Zr:Ti at a mole ratio of 52:48 having more than 10 mol % of PbO) is spin-cast on a wafer at 2500 rpm together with a pyrolysis process in an air atmosphere of 450° C. for 10 min. The deposition and pyrolysis step are performed repeatedly multiple times to form a 3 μm thick PZT thin film. The crystallization of the PZT thin film is performed in air at 650° C. for 45 min. For the pyrolysis and crystallization process, rapid thermal annealing (RTA) is used.

Figure 9:
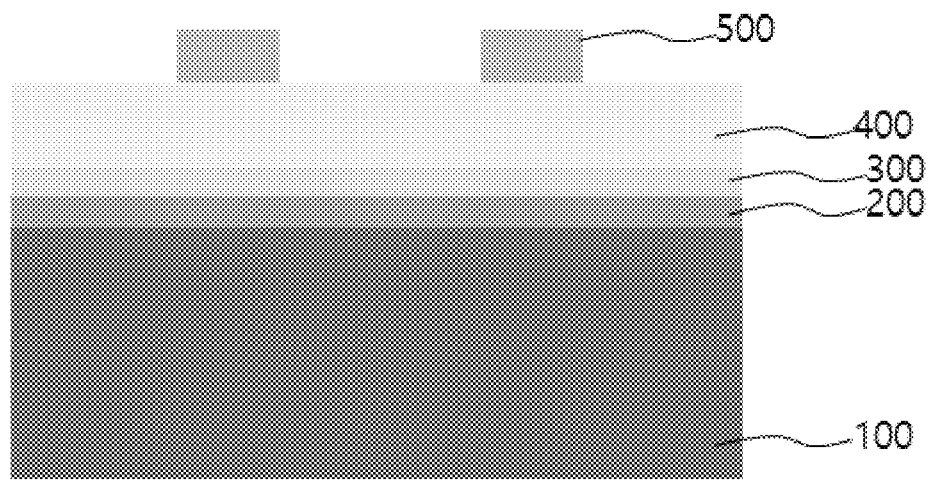

Referring to FIG. 9, the electrode 500 which is the metal layer, is stacked on the upper surface of the piezoelectric material layer 400. According to an embodiment of the present disclosure, the electrode 500 may be stacked through a common semiconductor process such as sputtering or physical vapor deposition (PVD), and may be stacked by a common metal coating method. The electrode 500 is formed as an Au/Cr electrode layer.

Figure 10:
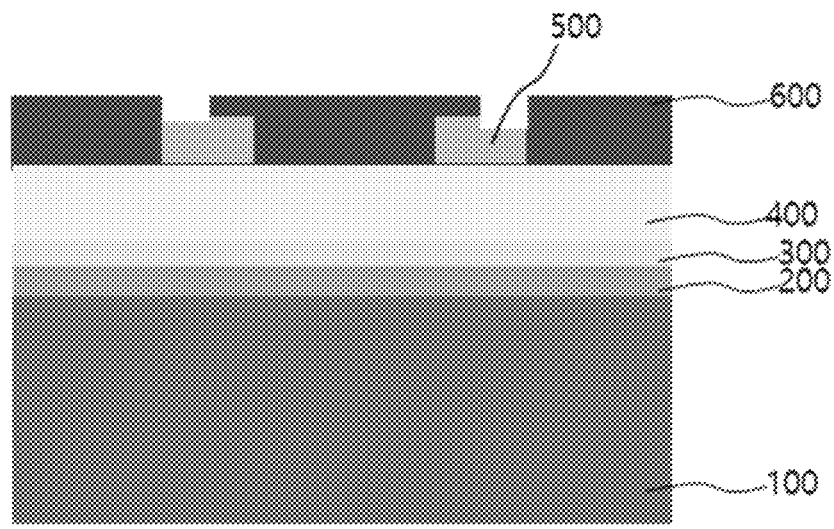

Referring to FIG. 10, the polymer layer 600 which is a passivation layer, is formed on the piezoelectric material layer 400 using a negative photoresist (PR) to prevent the damage of the thin film and fabricate a flexible device in the subsequent process.

Figure 11:
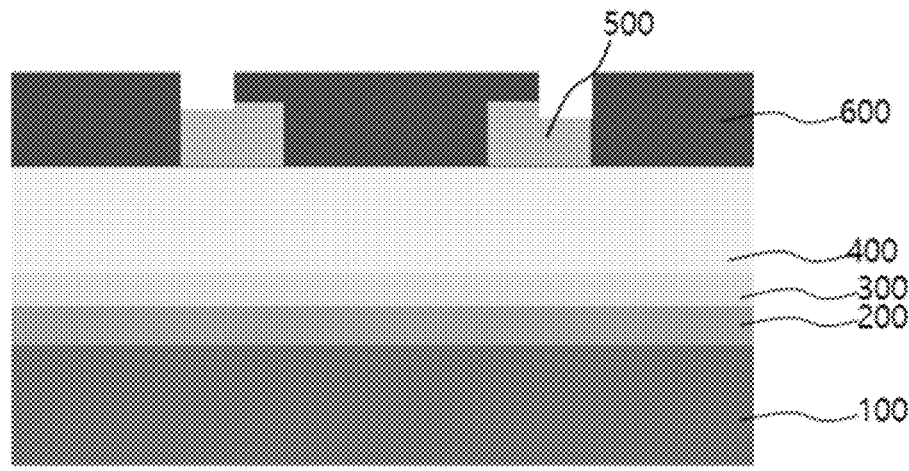

Referring to FIG. 11, for the subsequent DRIE process, the backside of the substrate 100 is polished to reduce the thickness from 650 μm to 350 μm. This is a process that makes the substrate 100 thinner due to the limited etch thickness.

Figure 12:
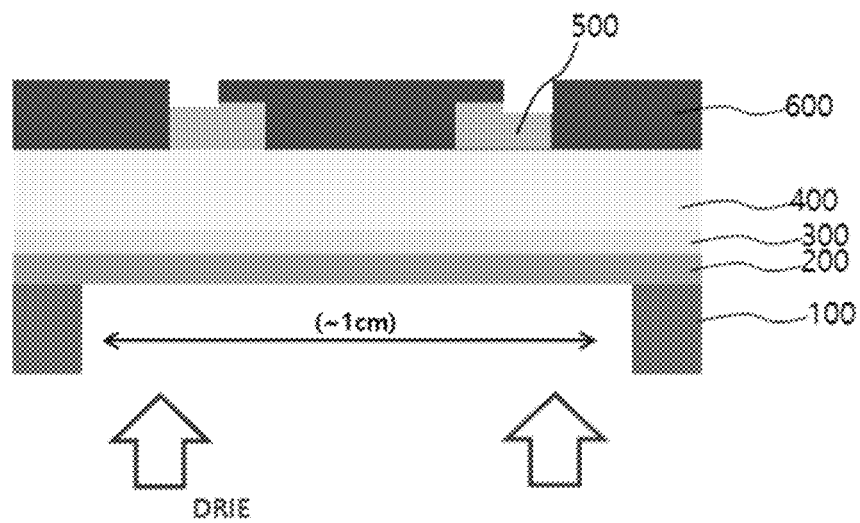

Referring to FIG. 12, the backside of the substrate 100 on which the piezoelectric material layer 400 is deposited is back-etched through a Bosch process to expose the active area including the sensor area negative piezoelectric layer. This is a Deep Reactive-ion etching (DRIE) process, and only the thin film (membrane) of about 5 μm thickness is left through the process. Meanwhile, the shape of the thin film space of the etched substrate 100 includes a circular or polygonal shape and the width ranges from 0.1 cm to 2 cm. Through this, the thin film may be exposed. That is, the backside processing of the substrate is performed by exposing a part of the thin film including the piezoelectric material layer 400, the electrode 500 and the polymer layer 600.

Accordingly, the substrate 100, the oxide layer 200, the metal layer 300, the piezoelectric material layer 400, the electrode 500 and the polymer layer 600 are stacked from the bottom. Here, a combination of the piezoelectric material layer 400 and the electrode 500 is defined as a unit channel, and a plurality of unit channels is arranged in line and separated from each other.

As a result, the voice sensor having the plurality of unit channels on the substrate 100 is completed.

The polymer layer 600 prevents the damage of the thin film of the flexible piezoelectric voice recognition sensor implemented by etching the substrate 100 and functions as a flexible device. That is, the polymer layer 600 may replace the function of the plastic substrate to which the piezoelectric thin film has been transferred through the transfer process.

Figure 13:
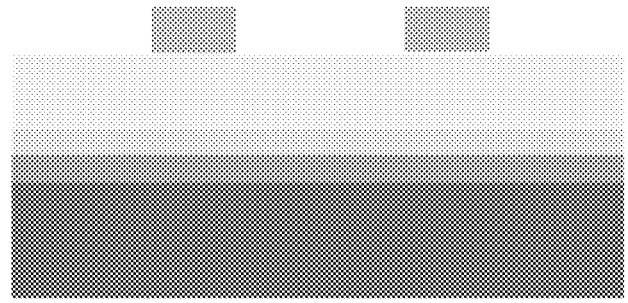
FIGS. 13 to 15 are process diagrams illustrating each step of a method for fabricating a piezoelectric voice recognition sensor according to another embodiment of the present disclosure.
Figure 14:
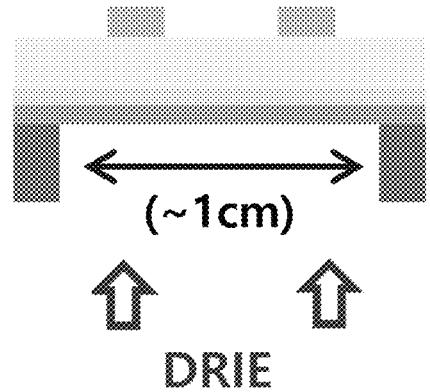
Figure 15:
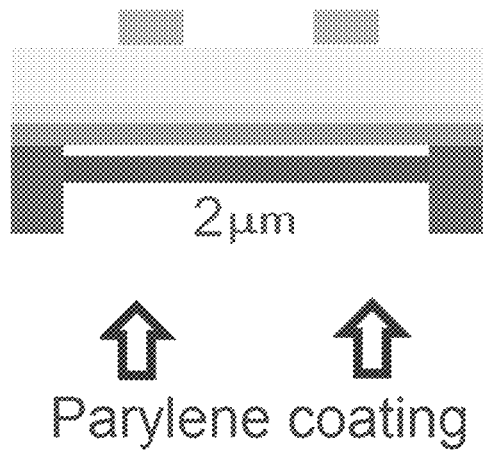

Referring to FIGS. 13 to 15, the polymer layer may cover the electrode 500, and may be deposited below the piezoelectric material layer 400 on the lower surface of the membrane etched through the DRIE process. The process of FIGS. 6 to 9 is performed in the same way by stacking the electrode 500 which is the metal layer on the upper surface of the piezoelectric material layer 400, polishing the backside of the substrate 100, and etching the backside of the substrate 100 through a Deep Reactive-ion etching (DRIE) process. In this state, parylene polymer coating is performed on the lower surface of the exposed thin film.

FIG. 15 shows an example of the final structure of the voice sensor, and the voice sensor is integrally fabricated by exposing a part of the thin film using the back etching process through the Bosch process such that a part of the substrate supports the thin film.

Figure 16:
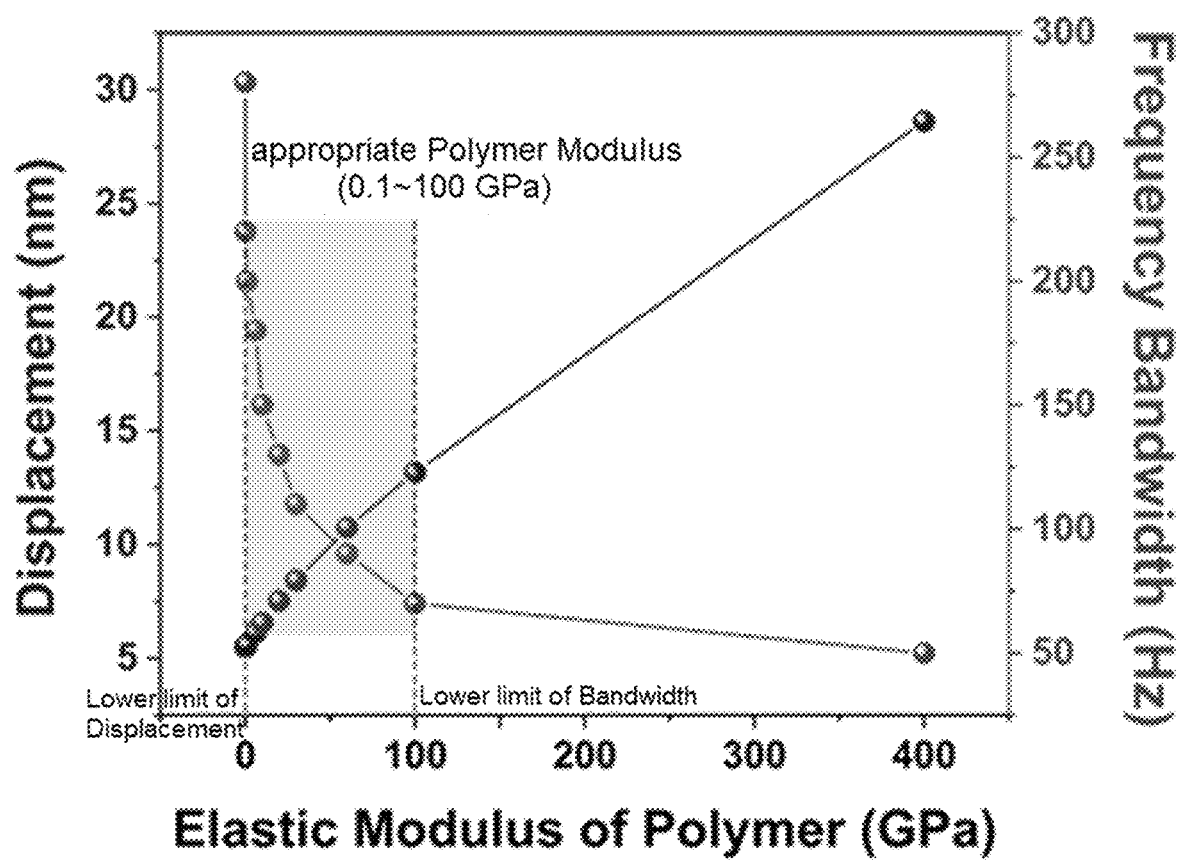
FIG. 16 shows modulus range setting data of polymer of an ultra-miniature voice sensor according to the present disclosure.

FIG. 16 shows modulus range setting data of polymer of the ultra-miniature voice sensor according to the present disclosure.

It can be seen that when the modulus reduces, the frequency bandwidth is wide, but sensitivity reduces due to the damping of the polymer. When the modulus is lower than a predefined range, PZT (high modulus) on the stiff substrate shows a sharp resonance peak, resulting in a narrow resonance frequency bandwidth and a low voice frequency coverage. Additionally, in the case of a material having the low modulus of 0.1 GPa or less, it is difficult to fabricate it as a thin film and thus it is impossible to use it.

In contrast, when the modulus increases, due to the small damping ratio and loss factor of the thin film, displacement is greater and accordingly sensitivity is higher, but the frequency bandwidth is narrower.

Based on this, the modulus of the polymer preferably ranges from 0.1 to 100 GPa. Preferably, the modulus of the polymer layer is different in a direction continuously or discontinuously within the same layer.

The voice sensor according to another aspect of the present disclosure senses sound through the piezoelectric material layer as described in FIG. 1, and the piezoelectric material layer is connected to a separate corresponding electrode (channel) for each frequency to detect and process a generated electrical signal according to the acoustic frequency range.

However, to sense sound in a wide resonance frequency bandwidth, the conventional technology needs to increase the width of the piezoelectric material for each condition, resulting in a very large width of the voice sensor.

To solve this problem, the present disclosure increases the thickness of the inorganic-based piezoelectric material layer and regulates the thickness of the polymer having relatively elasticity to a predetermined level to increase the sensitivity and the resonance frequency bandwidth, in order to broaden the frequency coverage.

Figure 17:
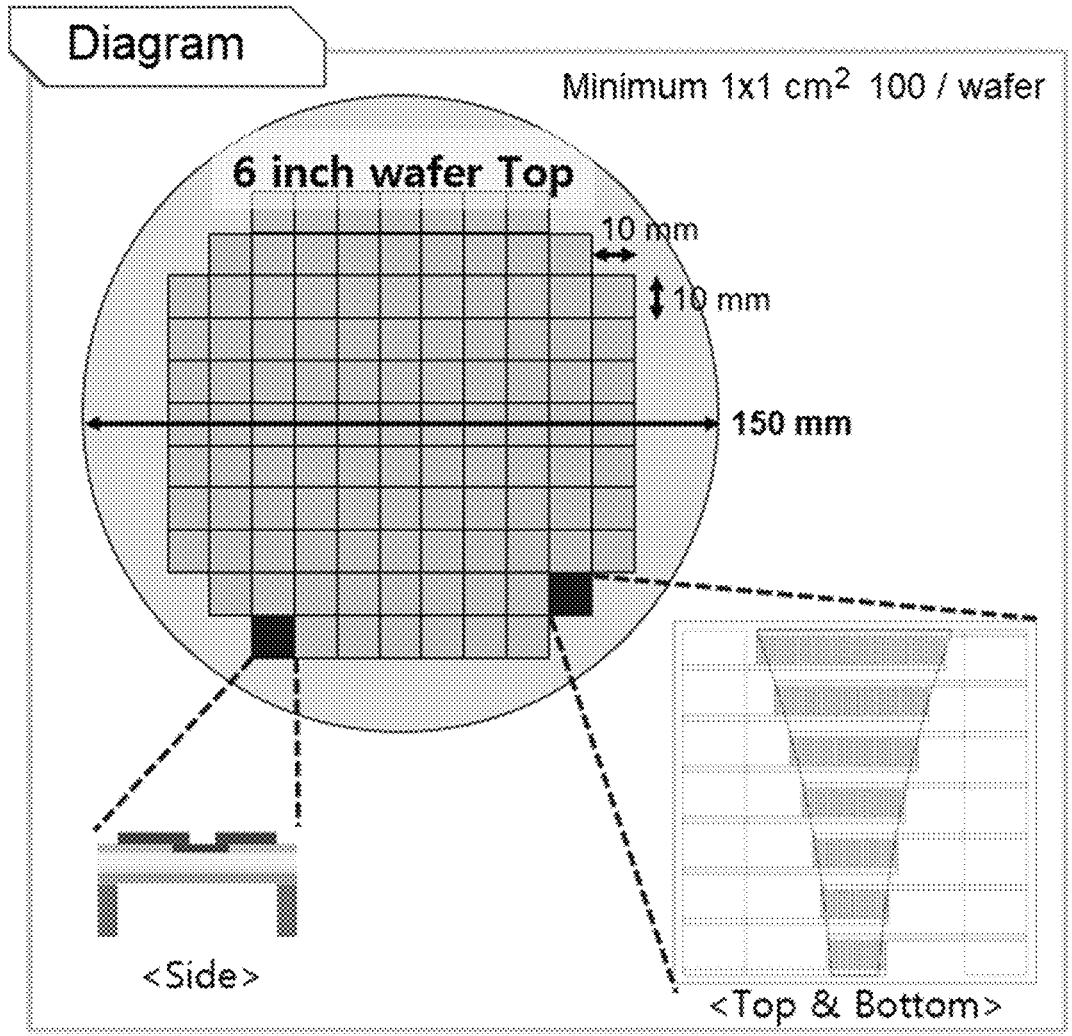
FIG. 17 is a diagram of a piezoelectric voice recognition sensor according to an embodiment of the present disclosure.

FIG. 17 shows the schematic illustration of the integral fabrication on single wafer. Mass production of flexible piezoelectric acoustic sensors enables the commercialization of highly sensitive flexible multi-channel acoustic sensors having uniform properties. Minimum 100 sensor dies of 1×1 cm$^2$ size can be fabrication on 6-inch wafer. The integrally fabricated sensors consist of supporting layer, piezoelectric thin film, multiple electrodes, and polymer layers. The position of polymer films can be the top, bottom, or both as shown inside view of a, b, and c. In addition, each exposed part including piezoelectric membrane, electrodes, and polymer layers can be the shape of circle or polygon.

Figure 18:
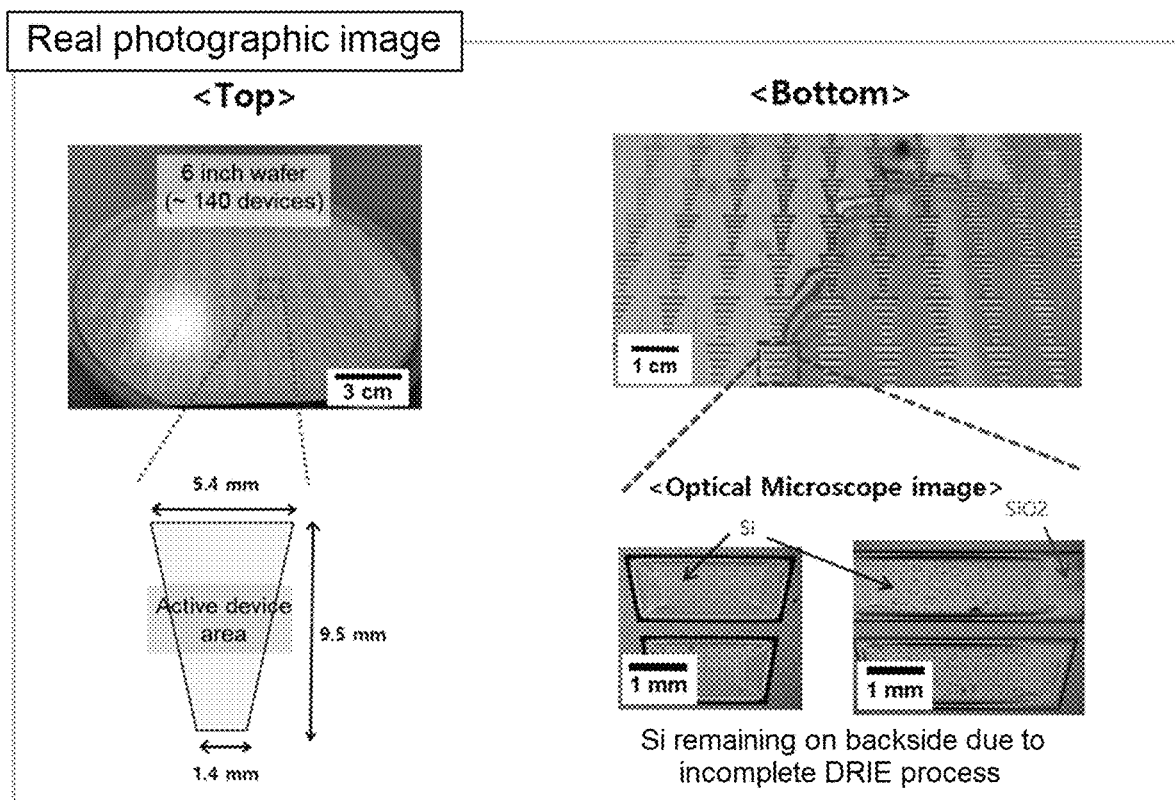
FIG. 18 is a real photographic image of a piezoelectric voice recognition sensor according to an embodiment of the present disclosure.

FIG. 18 displays the optical images of samples after each fabrication process. The multi-channel electrodes or polymer film can be deposited on the top or bottom side of piezoelectric layer by large-scale process. The shape/size of electrodes or polymer can be modified to polygon or circles/ 0.1-20 mm, respectively. The bottom side of substrates are etched by Bosch process (Deep Reactive Ion Etching), showing the curved trapezoidal shapes of active area. The exposed side (ex. $SiO_2$, $TiO_2$, $ZrO_2$ and so on) can be chemically or physically coated by the polymer. After dicing the whole wafer, each die can be used as the acoustic sensors. The interconnection to Printed Circuit Board can allow easier processing of sound signal from multiple channels.

Figure 19:
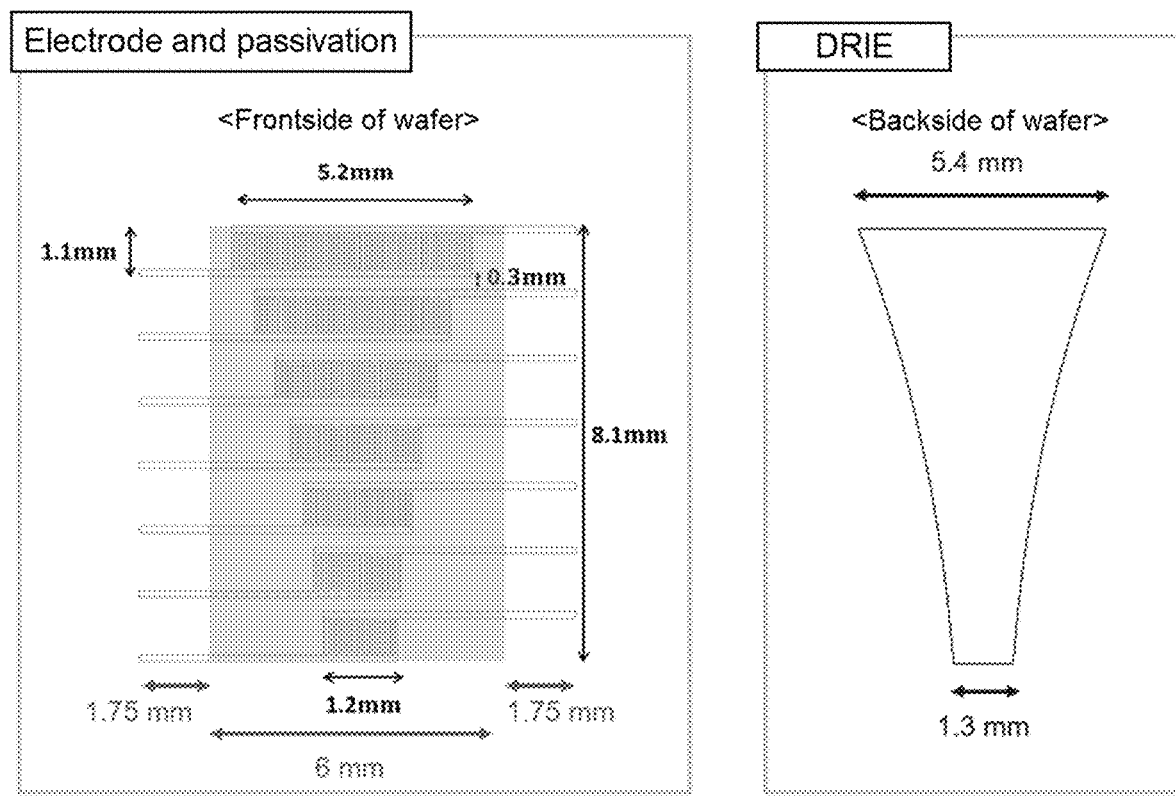
FIG. 19 is a diagram of a mask for fabricating a piezoelectric voice recognition sensor.

FIG. 19 shows the photomask design of electrode deposition, passivation, and DRIE process. The metal film (such as Cr, Ti, Cr, Au, or Pt) deposited on the bottom or top side of wafer is patterned by wet-etching or lift-off process. To protect the device from mechanical/electrical damage, the passivation layers (such as epoxy, parylene, polyimide, or polyethylene terephthalate) are deposited on top, bottom, or both sides. The shape, gap, width and height of multi-channel electrodes and passivation region can be modified simply by changing the layout. The basic shape of etched area is the curved trapezoidal in 0.1-20 mm, however, active area can be featured as circle or different polygon by DRIE process.

Figure 20:
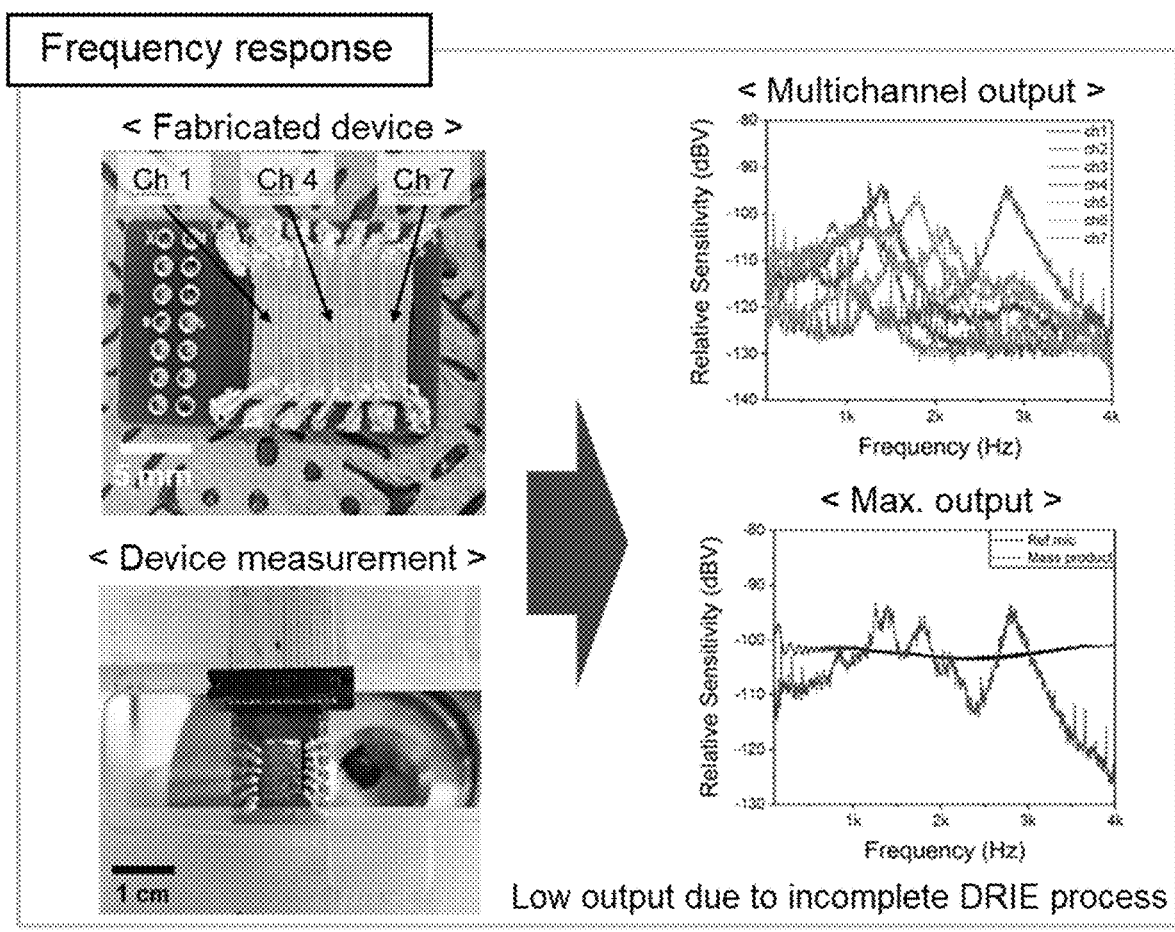
FIG. 20 shows the characteristics of a piezoelectric voice recognition sensor device according to an embodiment of the present disclosure.

FIG. 20 presents the measurement of flexible piezoelectric acoustic sensors fabricated by mass production. The devices can be interconnected to PCB by wiring, soldering, or flip chip bonding, which enables the connection of each channel to sound-module DAQ systems. The simultaneously measured frequency response of multi-channel exhibits multi-resonance bands. Maximum output of device shows higher sensitivity over 0.2-3.2 kHz, compared to reference microphone (G.R.A.S).

Figure 21:
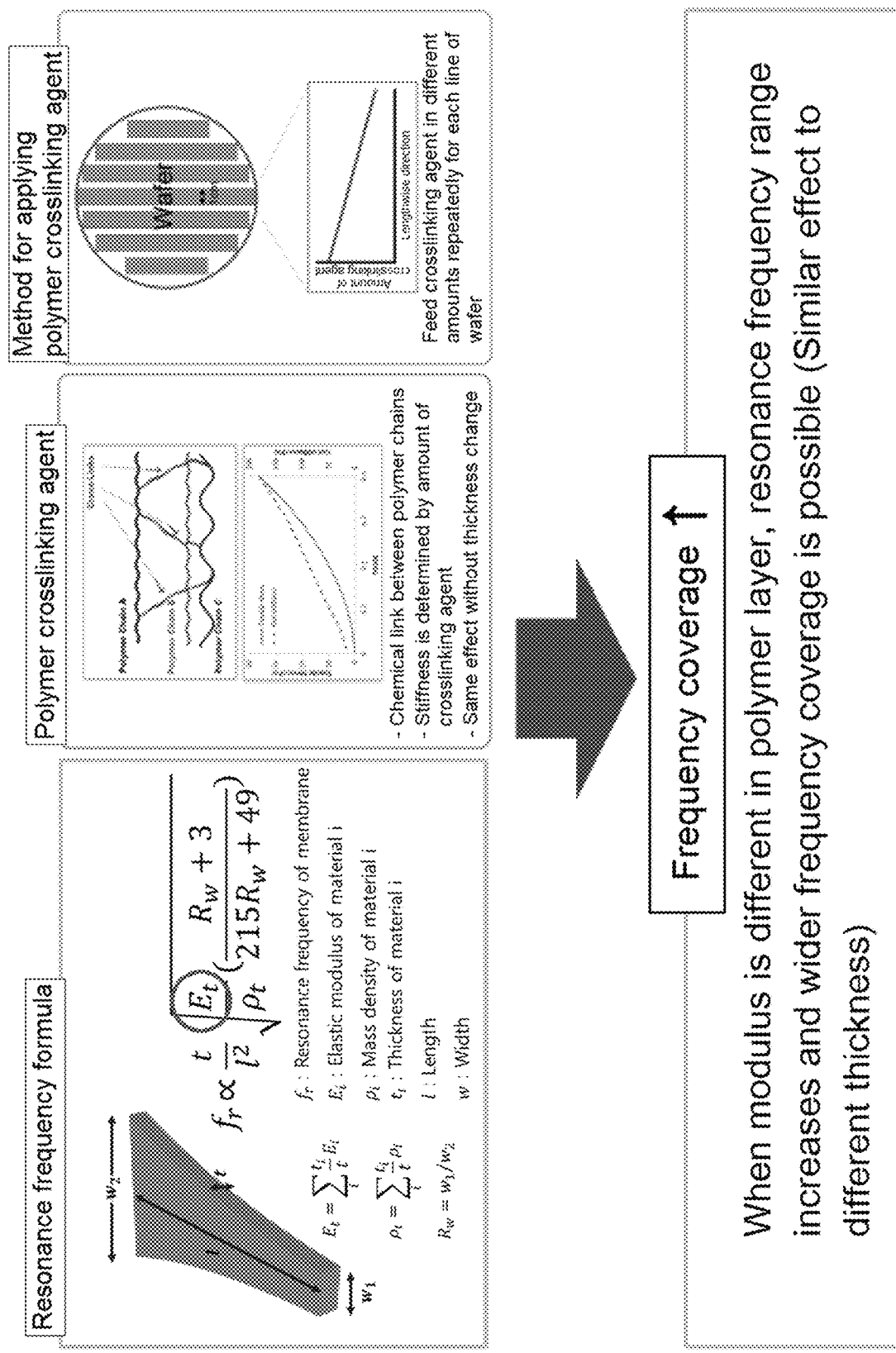
FIG. 21 shows a phenomenon caused by different modulus in a polymer layer.

FIG. 21 shows the methods for broadening the frequency coverage of flexible piezoelectric acoustic sensors. The resonance frequency of trapezoidal membrane is proportional to thickness and elastic modulus of thin film. The acoustic sensors with gradual thickness or modulus depending on the position exhibit more broad frequency response, compared to uniform thickness or modulus. The large-scale gradual thickness polymer can be fabricated on 6 inch-wafer by molding process. For example, thickness-gradient can be generated using grayscale lithography, which exposes different energy dose on each region. The PDMS molding process can replicate the gradual shape, enabling the repetitive patterning. The modulus of polymer materials can be easily modified by controlling the amount of crosslinking agent. Chemical crosslink between each chain of polymers increases the stiffness, inducing the lower strain than pristine polymer. To apply modulus-based method in mass production process, cross-linker is added by spraying different amount in lengthwise direction.

Figure 22:
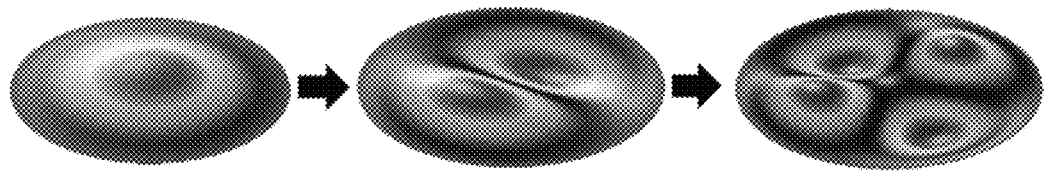
FIG. 22 shows resonance of a circular voice sensor.
Figure 22:
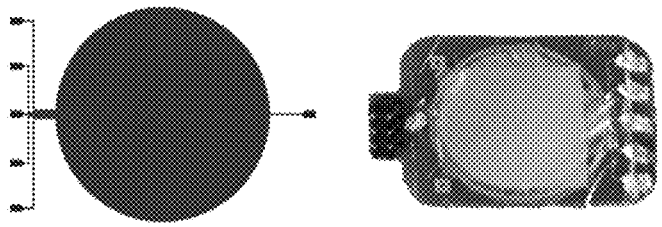

FIG. 22 displays the example of flexible piezoelectric voice sensors having another shape. The low resonance frequency generates the intensive vibration at the center of circular membrane, while the motions spread to edge region at the resonance frequencies of higher mode. Based on the FEM simulation result, the multi-electrode layout is designed for detecting sound signal over voice frequency. The device is also fabricated by using same fabrication process except the shape of active area.

Figure 23:
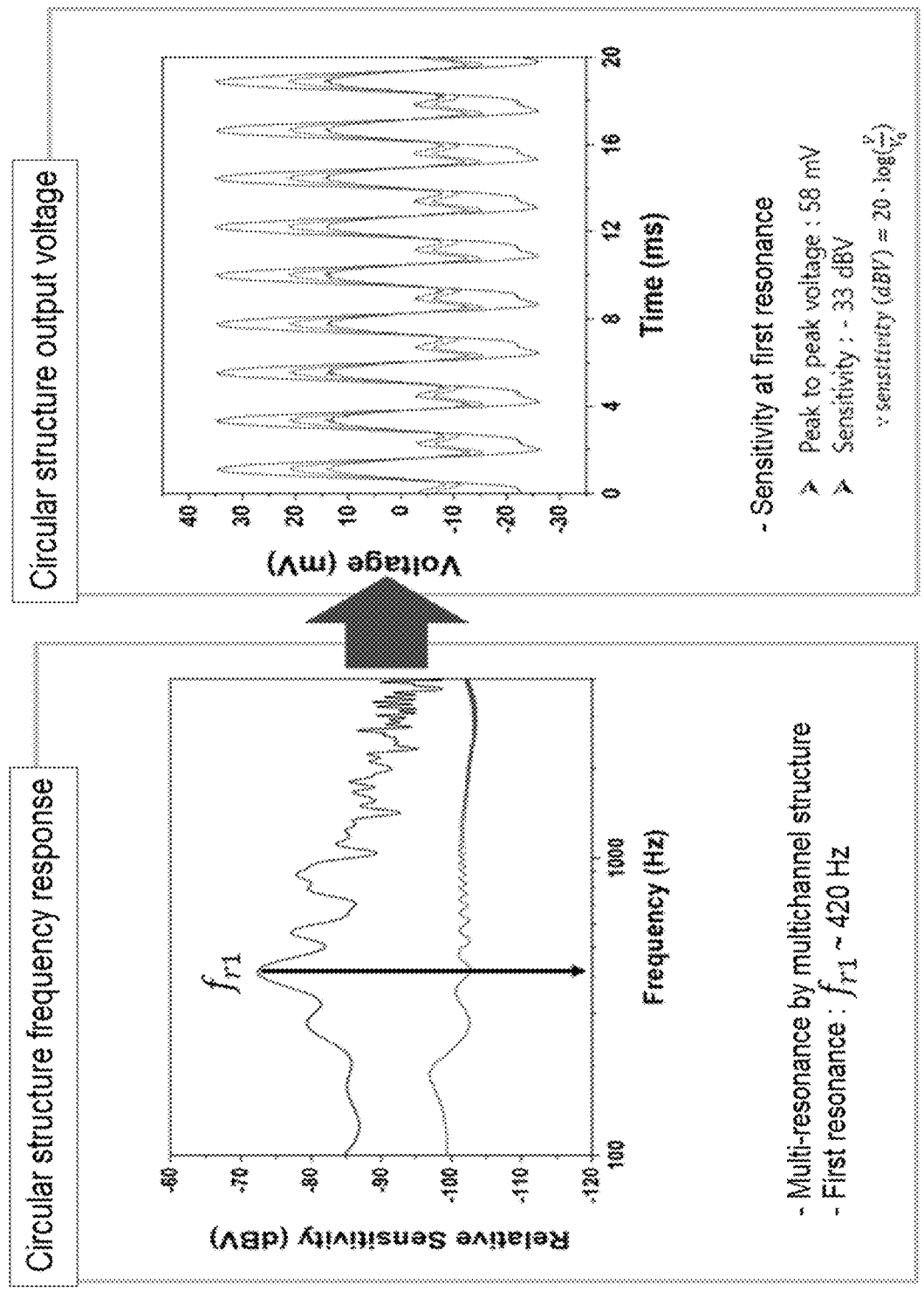
FIG. 23 shows the frequency response characteristics of a circular voice sensor.

FIG. 23 shows the frequency response and output voltage of circular flexible voice sensors. The circle-structured flexible piezoelectric acoustic sensors exhibit higher sensitivity over 100-4000 Hz range under white noise condition than reference microphone, showing the first resonance at 420 Hz. The self-powered acoustic sensors with circular shape generate the maximum peak-to-peak voltage of 58 mV by the monochromatic sound wave, which indicate the sensitivity of −33 dBV at resonance frequency.

Figure 24:
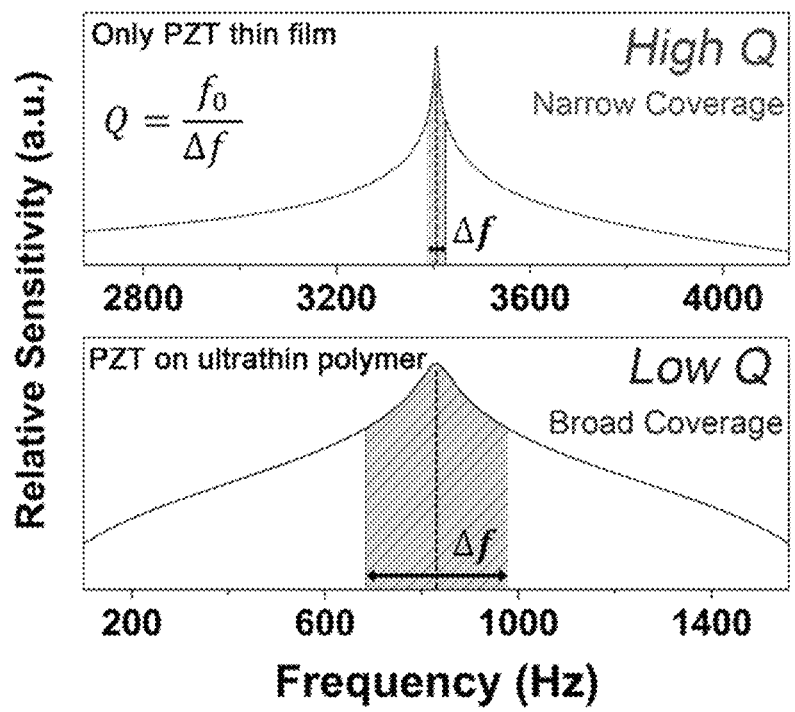
FIG. 24 shows comparison results of frequency characteristics between the use of a PZT piezoelectric material layer on a stiff substrate (High Q) and the use of a thin film polymer.

FIG. 24 shows the comparison results of frequency characteristics between the use of the PZT piezoelectric material layer on the stiff substrate (the silicon substrate) (High Q, modulus of 300 GPa or higher) and the use of PET which is a thin film polymer (Low Q, modulus of 1-2 GPa). Here, the dimensions of the piezoelectric material layer and the electrode are equal.

Figure 25:
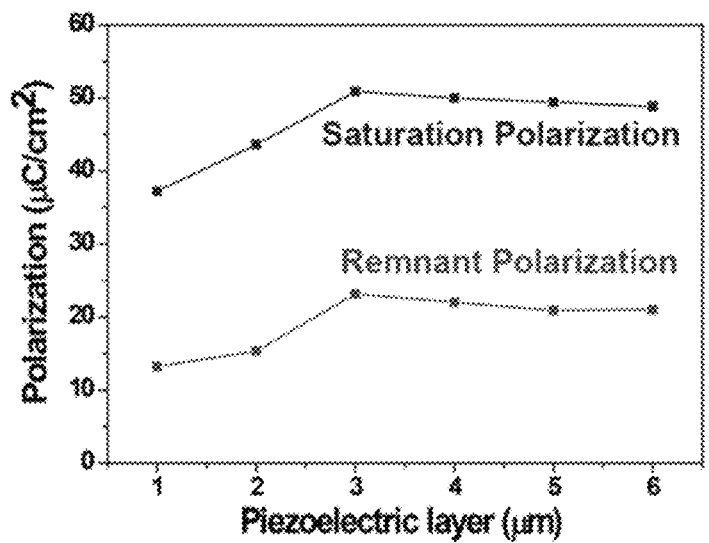
FIG. 25 shows comparative experiment results of sensitivity between sensors.

Referring to FIG. 25, when the polymer is used, the frequency band Δf is very broad. Finally, when the thin film polymer is used, the audio frequency range sensed in one channel may be wide, and due to the small thickness, the sensor area may reduce for the same frequency.

Figure 26:
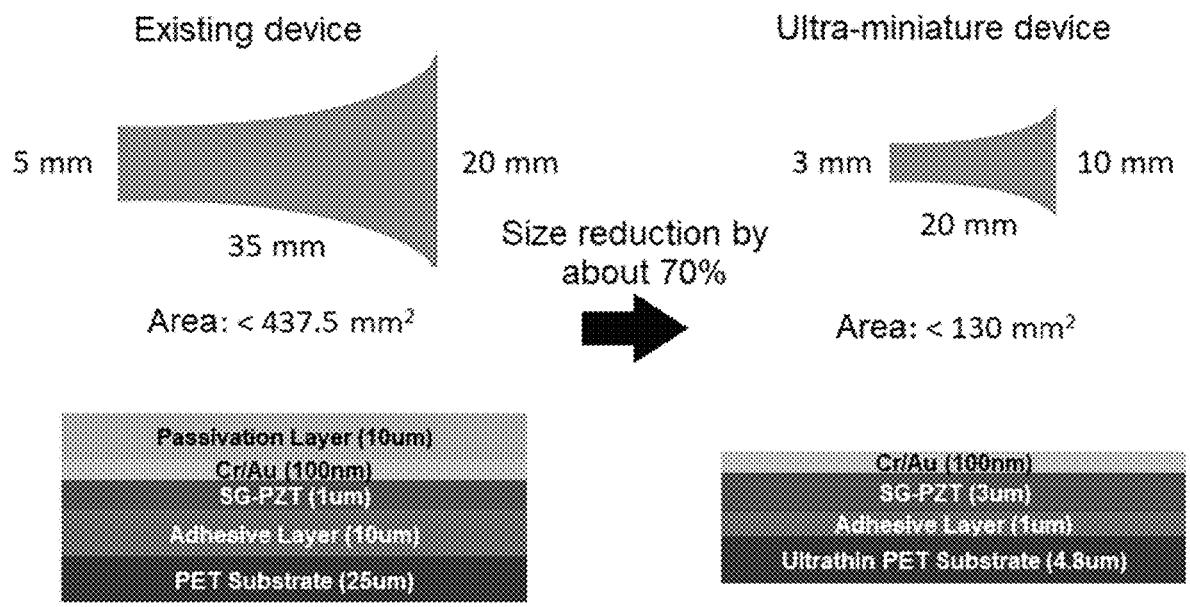
FIGS. 26 and 27 show a significant improvement in sensitivity when a thin film polymer has a predetermined level or less of thickness to the thickness of a piezoelectric layer.

FIG. 26 shows the comparative experiment results of sensitivity as a function of the thickness of the piezoelectric material layer.

Figure 27:
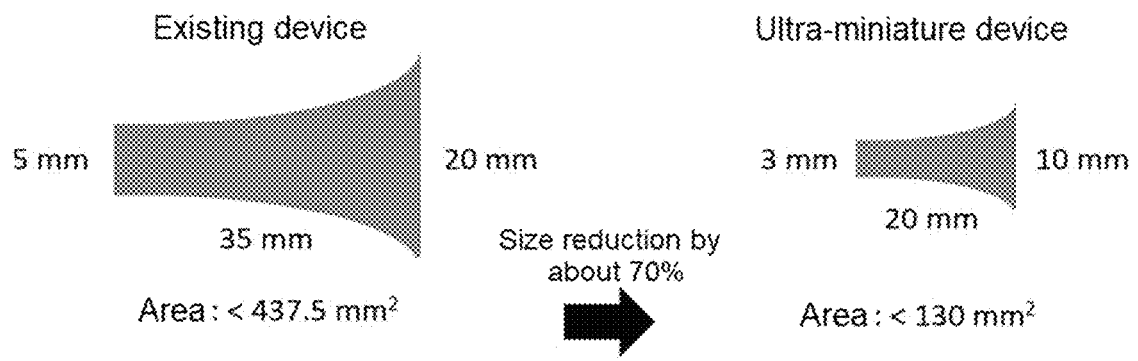
Figure 27:
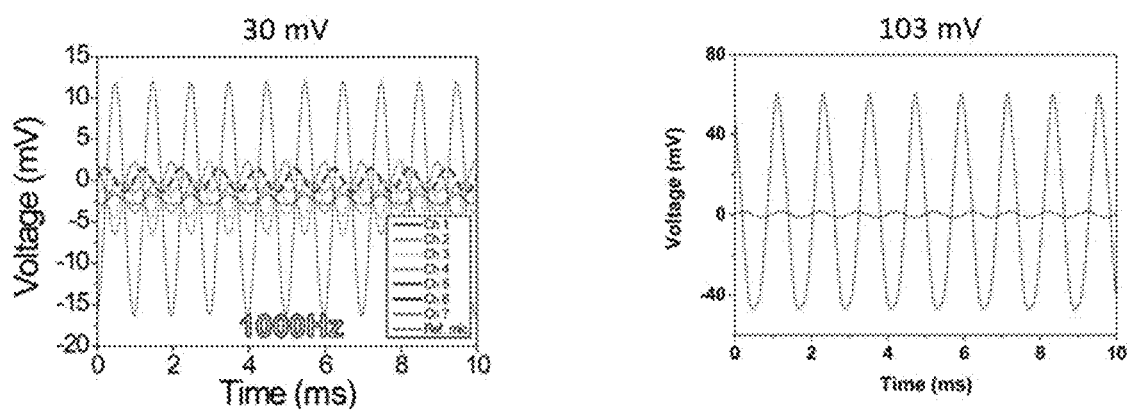

Referring to FIGS. 25 to 27, sensitivity is significantly improved by using the thin film polymer having a predetermined level or less of thickness to the thickness of the piezoelectric layer.

In detail, FIG. 25 shows the experiment performed on the piezoelectric layer of which the thickness is divided into 1-6 um for each condition, and since miniaturization reduces the area of the piezoelectric layer, the sensitivity of the piezoelectric voice sensor reduces. Accordingly, to solve this problem, it is necessary to increase the thickness of the piezoelectric layer, and as shown in the graph, saturation is seen in 3 um piezoelectric layer.

Meanwhile, FIGS. 26 and 27 show that the size of the device reduces by about 70% by changing the total thickness (~9 um) of the ultra-miniature device, compared to the total thickness (~46 um) of the existing device. That is, it is found that it is possible to place the resonance frequency of the sub-miniature sensor within the voice frequency range by reducing the total thickness of the device according to the resonance frequency formula.

Figure 28:
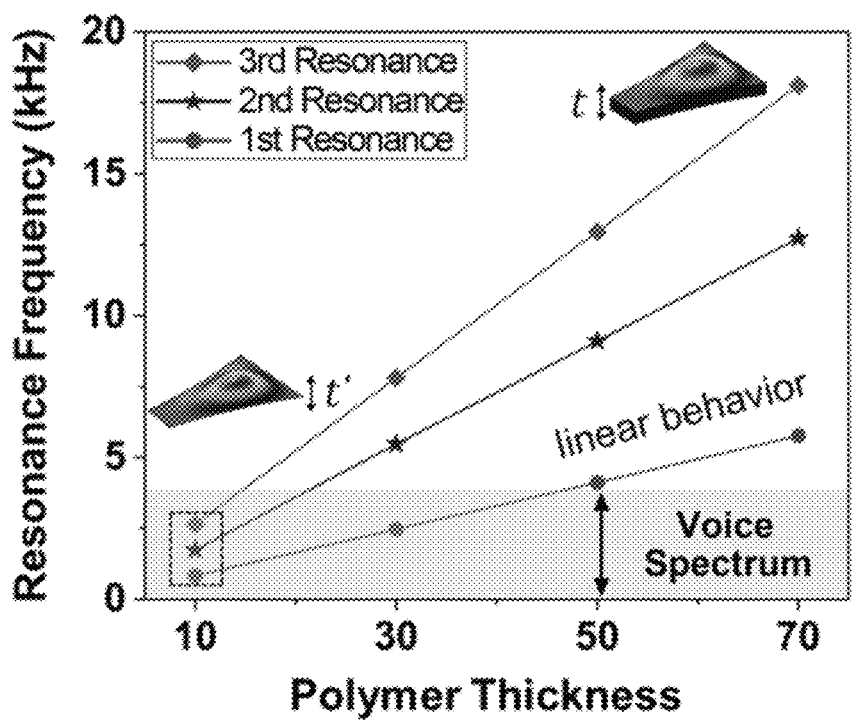
FIG. 28 shows frequency range vs thickness of a thin film polymer.

Referring to FIG. 28, the frequency range for each thickness of the thin film polymer is shown, and in case that the polymer is thick in the same area, the resonance frequency is outside of the voice frequency range according to the formula, and accordingly the ultrathin film polymer should be used.

Figure 29:
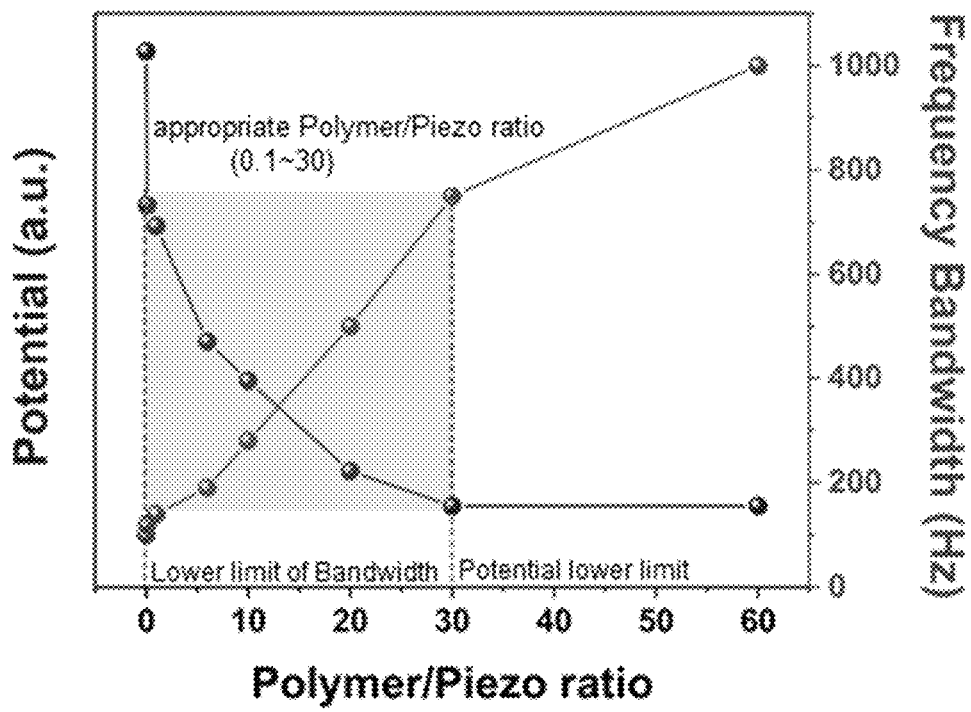
FIG. 29 shows range setting data as a function of a ratio of thickness of a polymer to thickness of a piezoelectric material layer on an ultra-miniature voice sensor according to the present disclosure.

FIG. 29 shows range setting data according to a ratio of the thickness of the polymer to the thickness of the piezoelectric material layer on the ultra-miniature voice sensor according to the present disclosure.

It can be seen that when the ratio of the polymer layer to the piezoelectric material layer is low, the electrical potential is high but the frequency bandwidth is narrow.

In contrast, it can be seen that when the ratio of the polymer layer is high, the frequency bandwidth is wide but the device is thick, resulting in vibration reduction of the thin film, and low sensitivity and potential.

Based on this, in the present disclosure, the thickness of the polymer preferably ranges between 0.1 and 30 relative to the thickness of the piezoelectric material layer.

Figure 30:
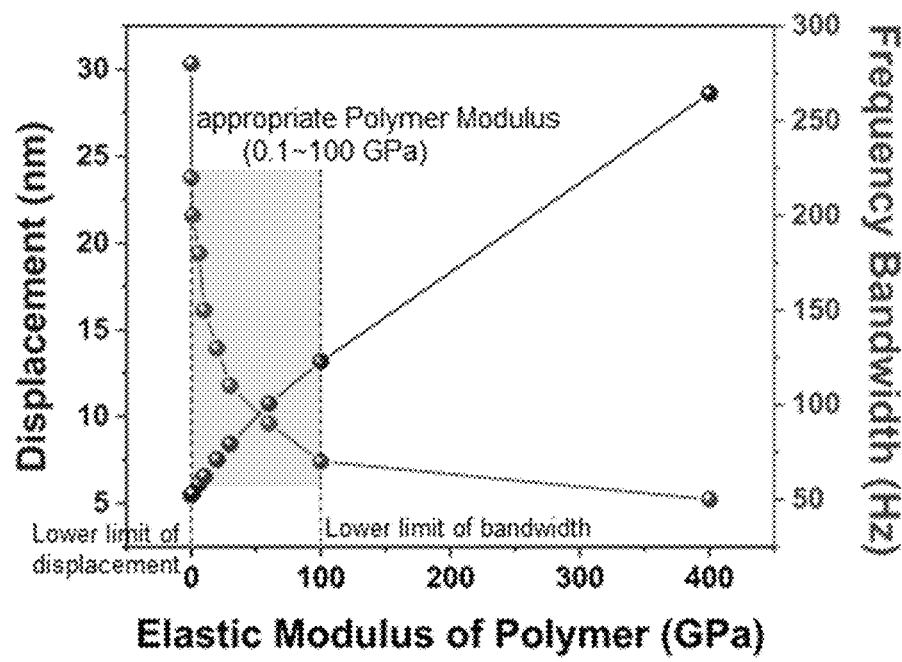
FIG. 30 shows modulus range setting data of polymer of an ultra-miniature voice sensor according to the present disclosure.

FIG. 30 shows polymer modulus range setting data of the ultra-miniature voice sensor according to the present disclosure.

It can be seen that when the modulus reduces, the frequency bandwidth is wide, but sensitivity reduces due to the damping of the polymer. When the modulus is lower than a predefined range, PZT (high modulus) on the stiff substrate shows a sharp resonance peak, resulting in a narrow resonance frequency bandwidth and a low voice frequency coverage. Additionally, in the case of a material having the low modulus of 0.1 GPa or less, it is difficult to fabricate it as a thin film and thus it is impossible to use it.

In contrast, when the modulus increases, due to the small damping ratio and loss factor of the thin film, displacement is greater and accordingly sensitivity is higher, but the frequency bandwidth is narrower.

Based on this, the modulus of the polymer preferably ranges from 0.1 to 100 GPa.

Figure 31:
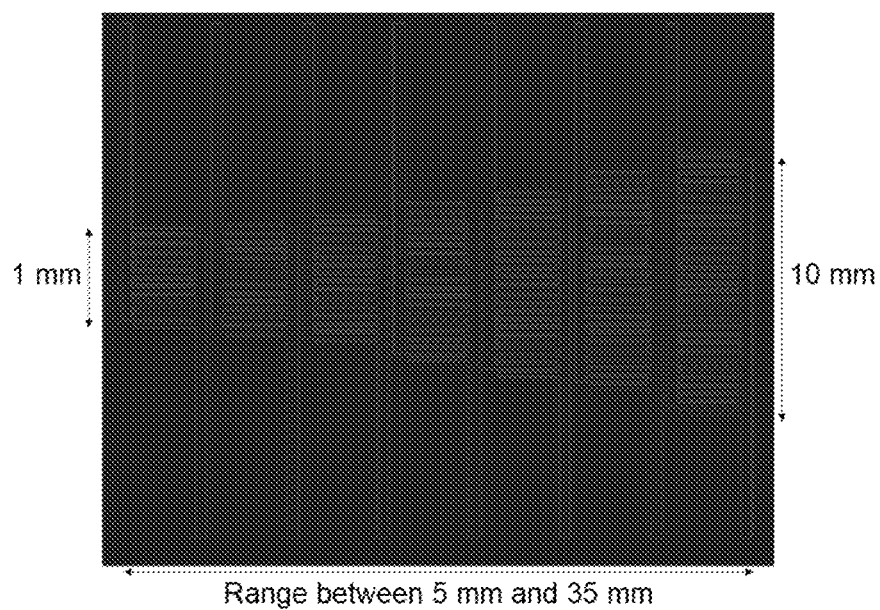
FIG. 31 is a plane view of channels of a voice sensor according to an embodiment of the present disclosure.

FIG. 31 is a plane view of the channels of the voice sensor according to an embodiment of the present disclosure. Referring to FIG. 31, it can be seen that the voice sensor according to an embodiment of the present disclosure includes the plurality of unit channels having different length for each sensing target frequency range. In an embodiment of the present disclosure, the length of the plurality of unit channels is at the level of 1 mm to 10 mm, but the scope of the present disclosure is not limited thereto.

Figure 32:
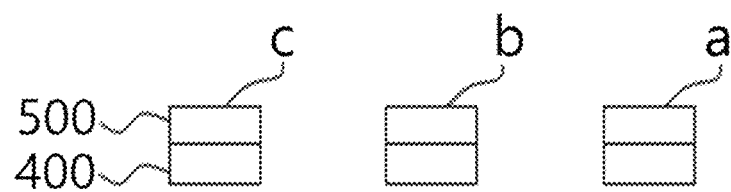
FIGS. 32 and 33 are a cross-sectional view and a plane view of a voice sensor according to the present disclosure.
Figure 33:
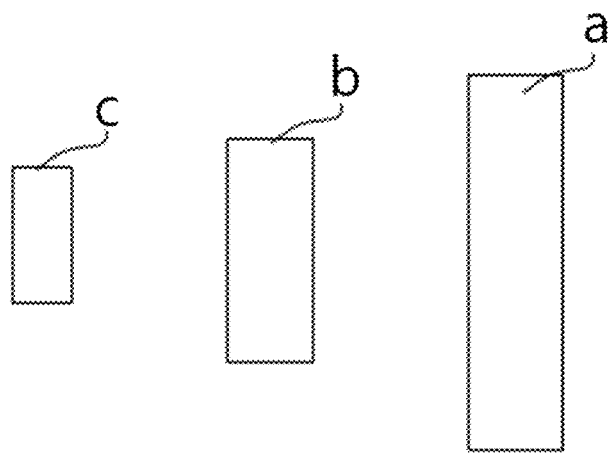

FIGS. 32 and 33 are a cross-sectional view and a plane view of the voice sensor according to the present disclosure.

The voice sensor according to an embodiment of the present disclosure includes the piezoelectric material layer 400 and the electrode 500 for detecting an electrical signal from the piezoelectric material layer, and a combination of the piezoelectric material layer and the electrode is defined as a unit channel and a plurality of unit channels a, b, c is arranged in line and separated from each other.

Figure 34:
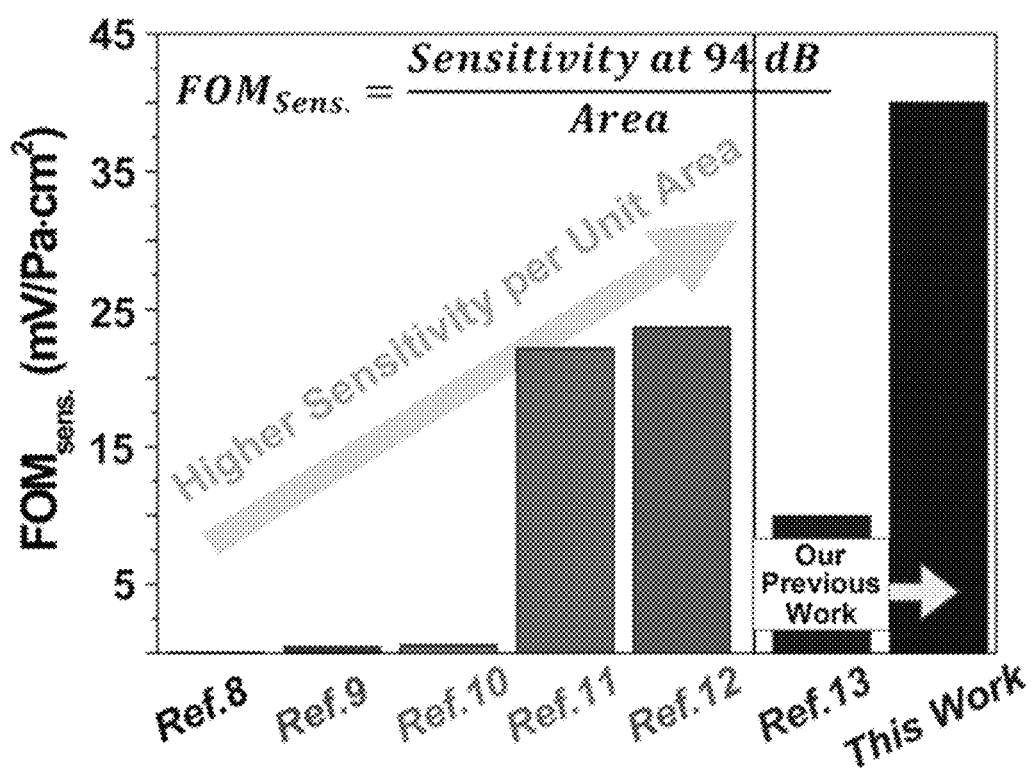
FIG. 34 shows a sensitivity difference between a voice sensor according to the present disclosure and a voice sensor according to the related art.

FIG. 34 shows a sensitivity difference between the voice sensor according to the present disclosure and the voice sensor according to the related art. The voice sensor according to the present disclosure shows high sensitivity in a small area, compared to other resonance type flexible piezoelectric voice sensors. Particularly, it can be seen that the voice sensor according to the present disclosure has much higher sensitivity performance index than the previous flexible piezoelectric voice sensor.

Figure 35:
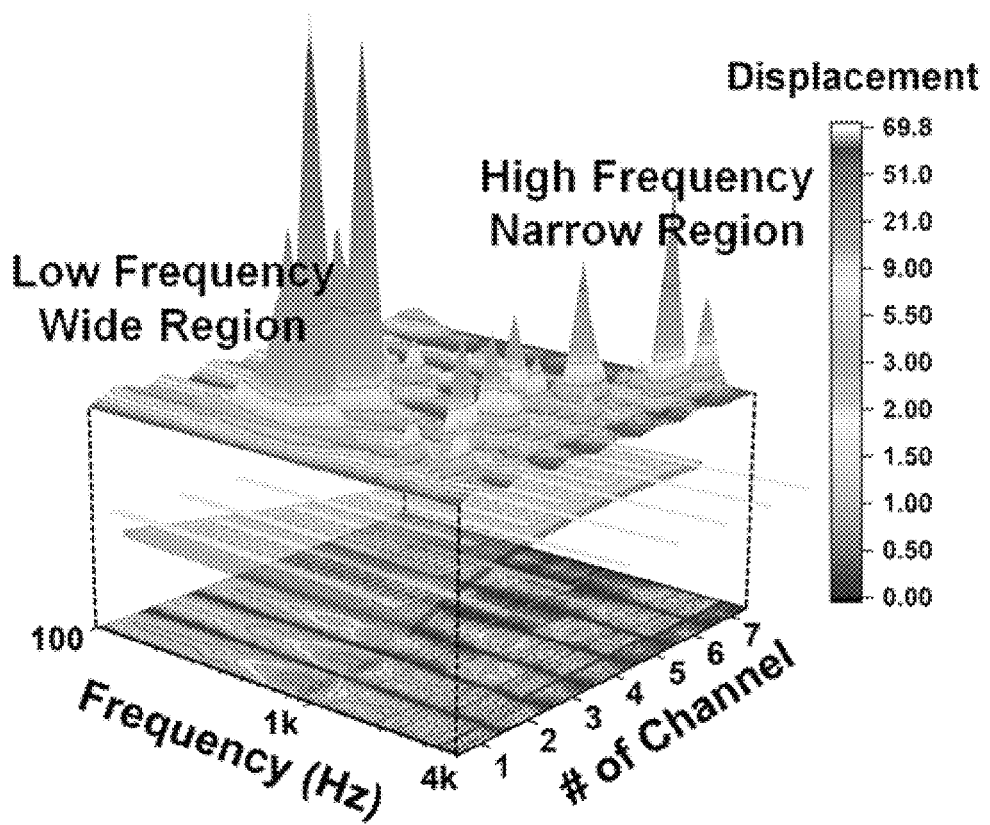
FIG. 35 shows the resonance characteristics of an ultra-miniature voice sensor using an ultrathin film polymer according to the present disclosure.

FIG. 35 shows the resonance characteristics of the ultra-miniature voice sensor using the ultrathin film polymer according to the present disclosure.

When general standard sound is applied, frequency separation occurs for each channel, and in the wide channel, resonance occurs at low frequency, and in the narrow channel, resonance occurs at high frequency.

The data of FIG. 35 shows the mechanical properties showing how the membrane vibrates.

Figure 36:
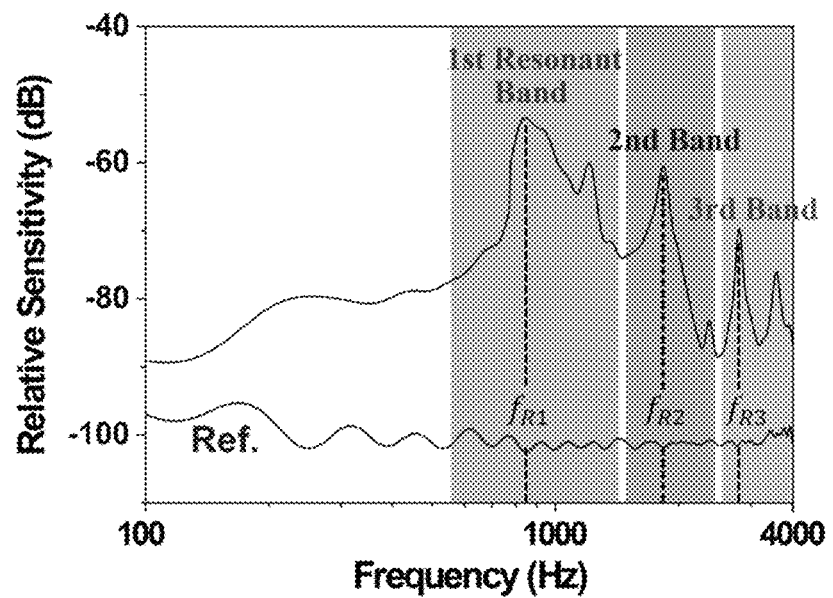
FIG. 36 shows the frequency response characteristics of an ultra-miniature voice sensor according to the present disclosure.
Figure 36:
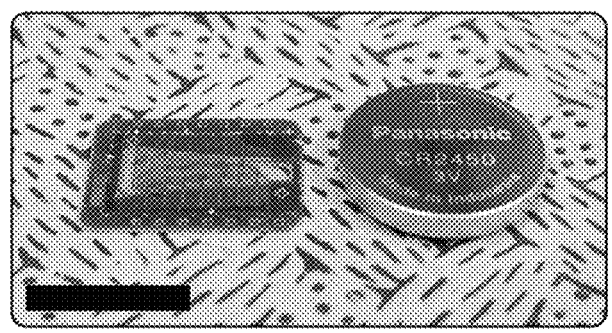

FIG. 36 shows the frequency response characteristics of the ultra-miniature voice sensor according to the present disclosure.

The left graph of FIG. 36 is a graph created by plotting the maximum value selected for each frequency. That is, it covers the voice frequency range of 100-4000 Hz, showing the advantage of multichannel and having a high sensitivity value. Additionally, since the ultrathin film polymer is used, it is found that the bandwidth is wide at each resonance frequency. On the other side, the right photographic image shows an ultra-miniature voice sensor that is as small as the size of a commercial battery.

Figure 37:
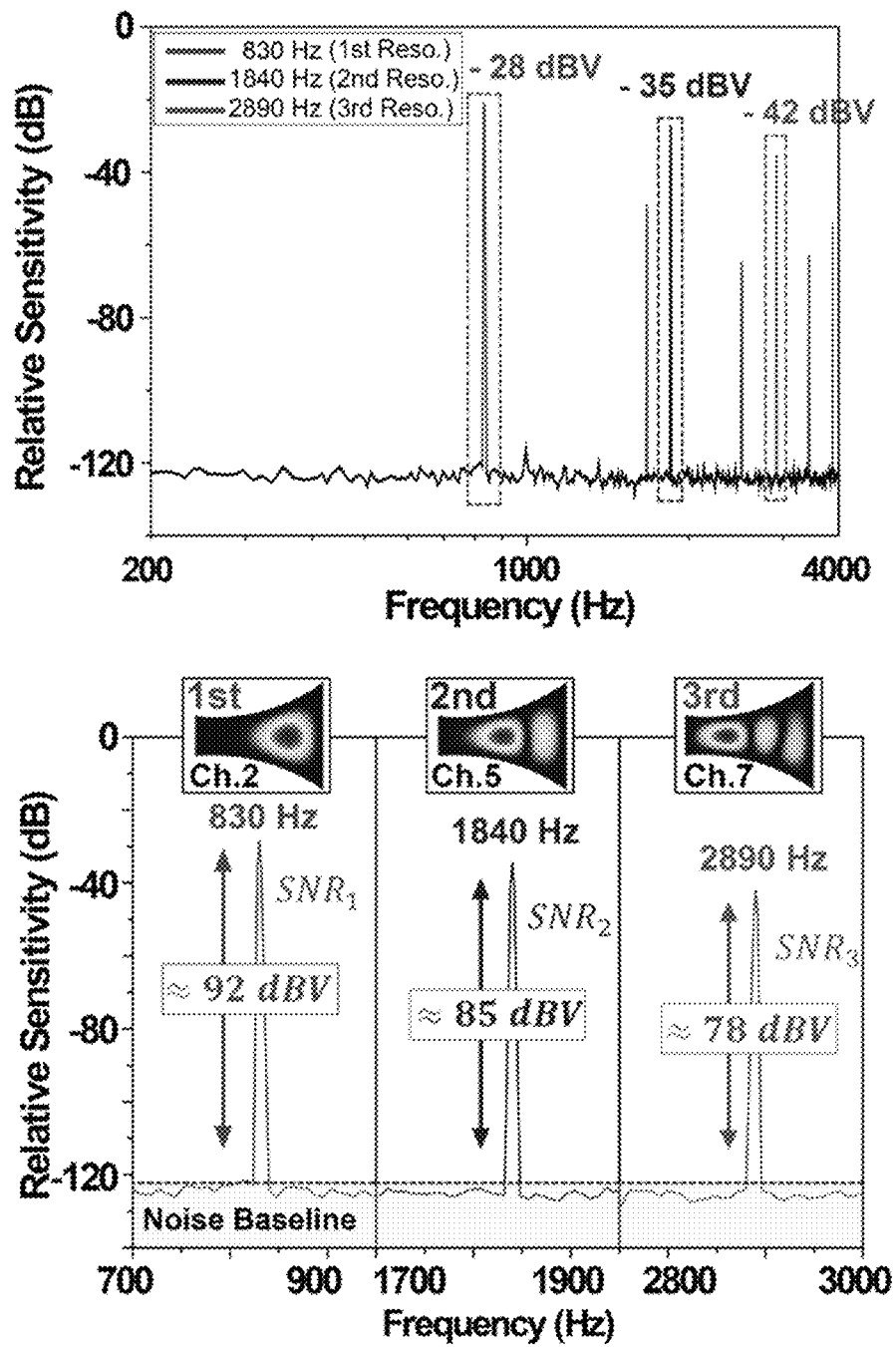
FIG. 37 shows sensitivity and signal-to-noise ratio (SNR) characteristics of an ultra-miniature voice sensor according to the present disclosure.

FIG. 37 shows sensitivity and signal-to-noise ratio (SNR) characteristics of the ultra-miniature voice sensor according to the present disclosure. The left graph shows a high sensitivity value seen at each resonance frequency in the frequency domain. The voice sensor shows a high sensitivity value of −28 dB by self-oscillation without an amplifier circuit, and it is much higher than the average sensitivity of commercial microphones of −45 dB.

On the other side, the right graph shows the SNR. Likewise, a high SNR value is shown, and it is higher than the average SNR of commercial microphones of −65 dB.

Figure 38:
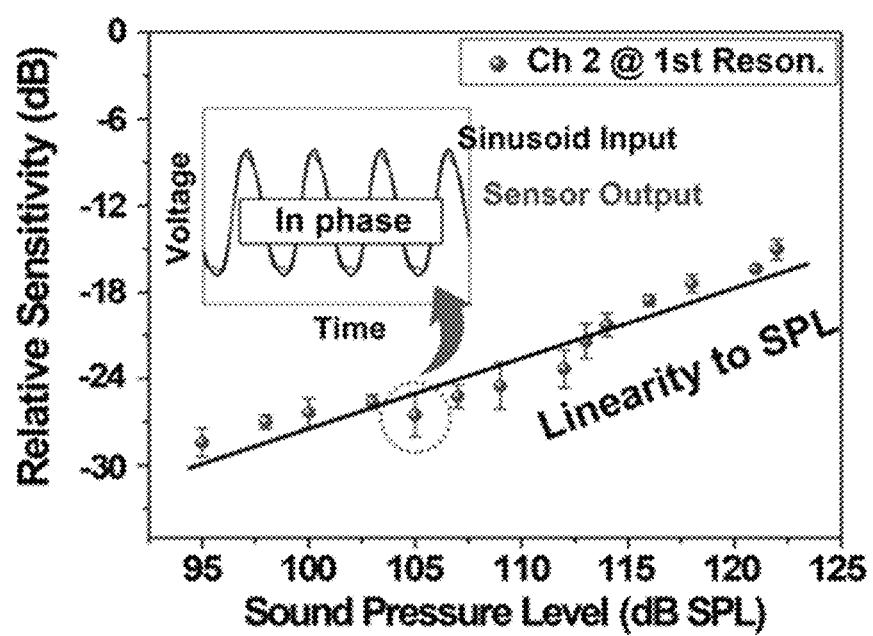
FIG. 38 shows a linear increase in sensitivity of a voice sensor as a function of sound pressure level.

FIG. 38 shows a linear increase in sensitivity of the voice sensor as a function of sound pressure level (unit: dB SPL). This shows that the voice sensor can recognize sound in various frequency ranges.

Meanwhile, the voice sensor according to another aspect of the present disclosure broadens the voice sensing frequency range by varying the thickness of the voice sensor including the channels including piezoelectric material layer-electrode.

Figure 39:
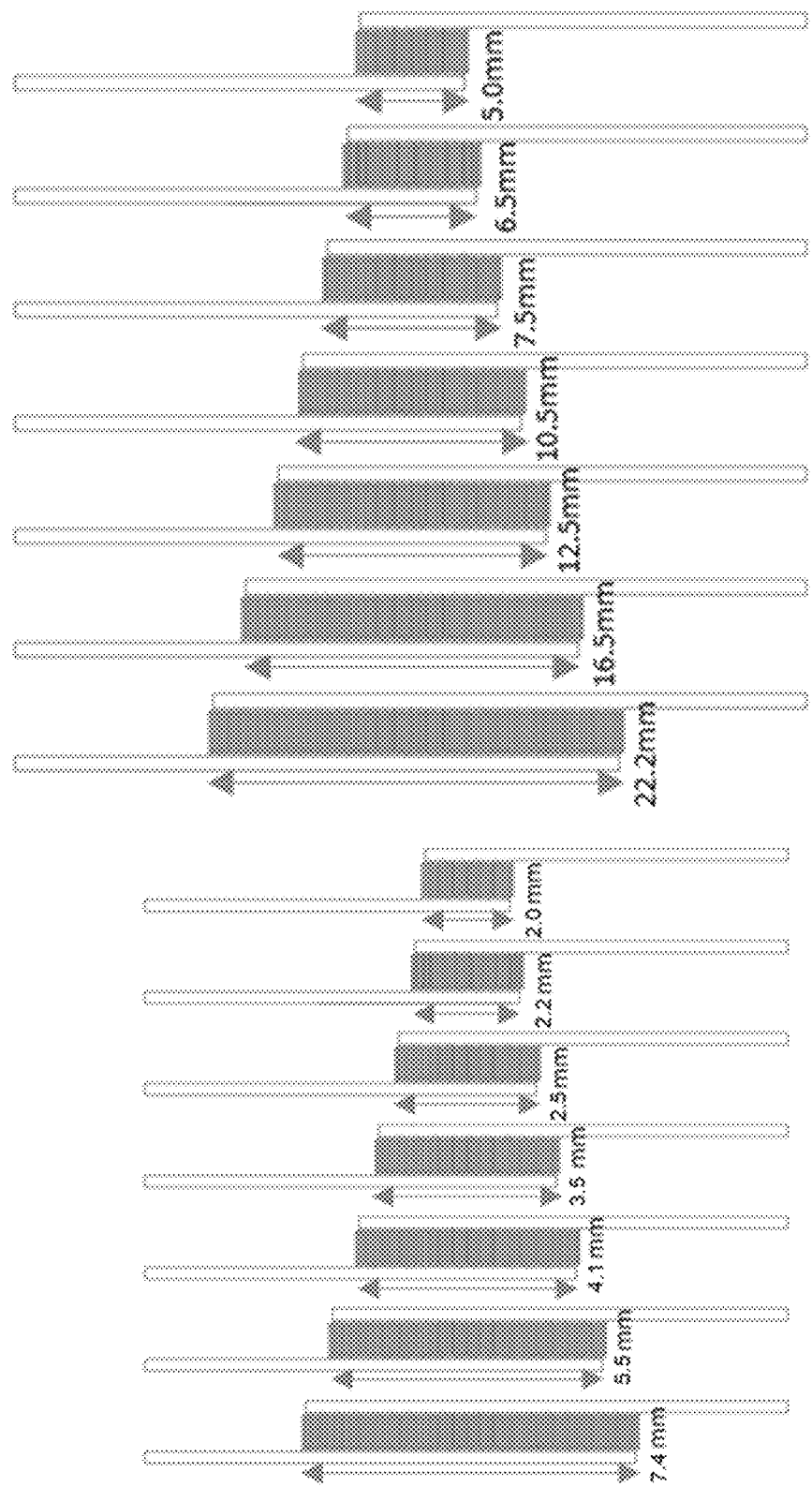
FIG. 39 is a plane view of channels of a voice sensor according to an embodiment of the present disclosure.

FIG. 39 is a plane view of the channels of the voice sensor according to an embodiment of the present disclosure.

Referring to FIG. 39, it can be seen that the voice sensor according to an embodiment of the present disclosure includes the plurality of unit channels having different length for each sensing target frequency range. In an embodiment of the present disclosure, the length of the plurality of unit channels is at the level of 5.0 mm to 22.2 mm, but the scope of the present disclosure is not limited thereto.

Figure 40:
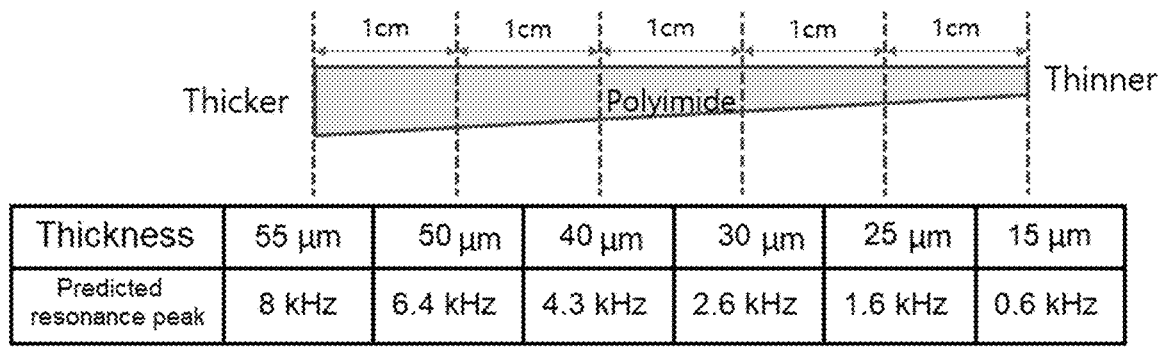
FIGS. 40 and 41 show measurement results of resonance peaks (the center of resonance frequency) of a voice sensor having different thickness (FIG. 40) and a voice sensor having the same thickness (FIG. 41) in the same channel structure as FIG. 39.
Figure 41:
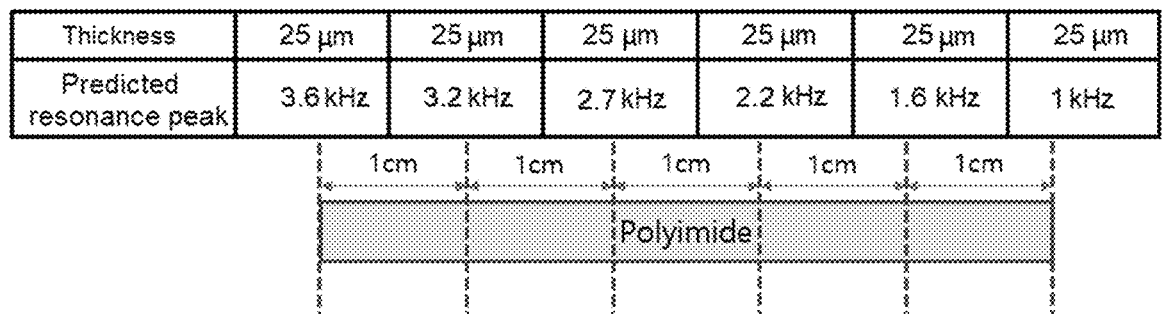

FIGS. 40 and 41 show the measurement results of resonance peaks (the center of resonance frequency) of a voice sensor having different thickness (FIG. 40) and a voice sensor having the same thickness (FIG. 41) in the same channel structure as FIG. 39. Here, the thickness of the voice device is equal or different by controlling only the thickness of the substrate (flexible thin film) of the device.

Referring to FIGS. 40 and 41, it can be seen that when the thickness is equal, the sensing frequency range is at the level of 1 kHz to 3.6 kHz, while when only the sensor thickness is different, the resonance frequency range is expanded to the range of 0.1 kHz to 10 kHz.

This implies that the total thickness of the sensor varying by the piezoelectric material layer or the electrode regarded as an active component in voice sensing but also a passive component such as the substrate or the passivation layer actually affects the sensing frequency range.

Figure 42:
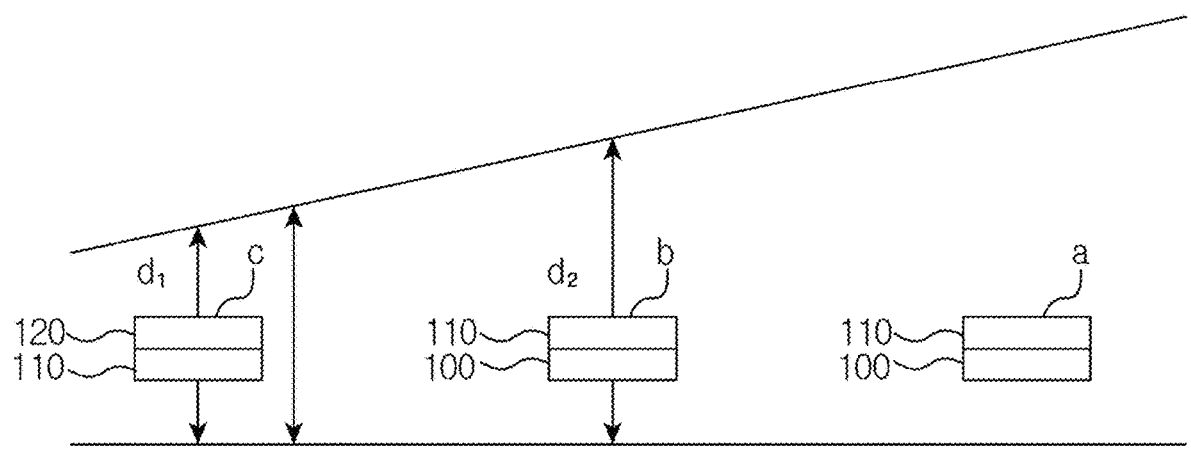
FIGS. 42 and 43 are a cross-sectional view and a plane view of a voice sensor according to an embodiment of the present disclosure.
Figure 43:
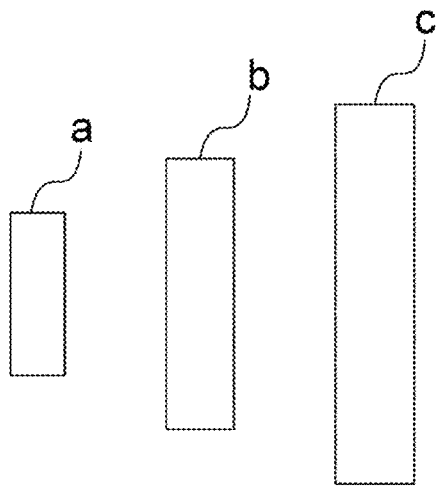

FIGS. 42 and 43 are a cross-sectional view and a plane view of the voice sensor according to an embodiment of the present disclosure.

Referring to FIGS. 42 and 43, the voice sensor 100 according to an embodiment of the present disclosure includes the piezoelectric material layer 110; and the electrode 120 for detecting an electrical signal from the piezoelectric material layer, and a combination of the piezoelectric material layer and the electrode is defined as a unit channel, and a plurality of unit channels a, b, c is arranged in line and separated from each other.

In this instance, the sensor thickness d1, d2 in the unit channel a and the unit channel b is different, and preferably, the channel for sensing at least low frequency sound is thin, and the channel for sensing high frequency sound is thick. That is, in the voice sensor according to the present disclosure, at least two of the plurality of unit channels configured to sense sound in different frequency ranges have different thickness with respect to the center of the channel, resulting in a wide frequency range of the voice sensor.

As described above, the sensor thickness of the plurality of unit channels may vary by the thickness of the layer such as the substrate or the passivation layer.

Figure 44:
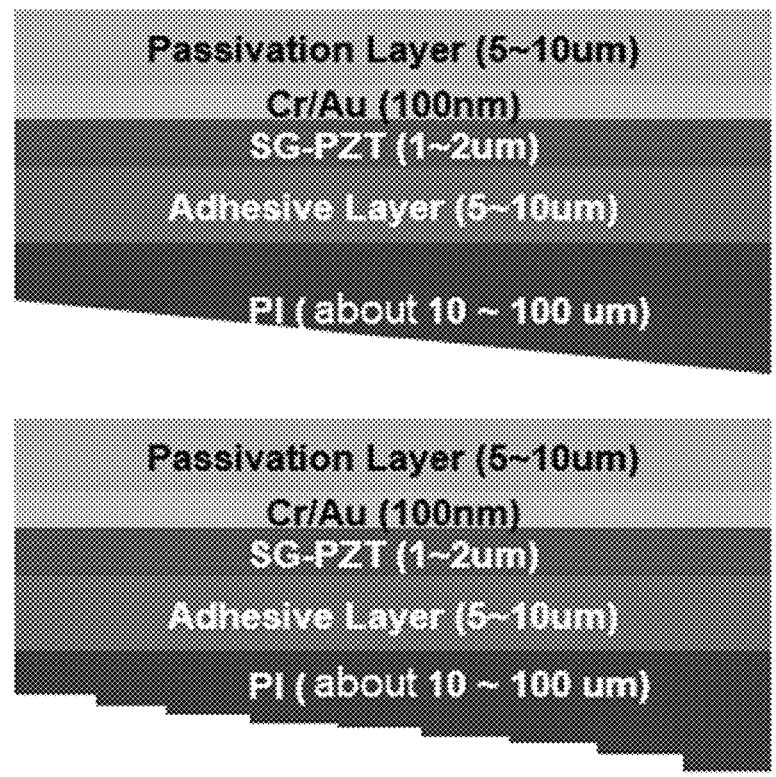
FIGS. 44 and 45 are cross-sectional views of voice sensors having changes in sensor thickness by a substrate or a passivation layer respectively.
Figure 45:
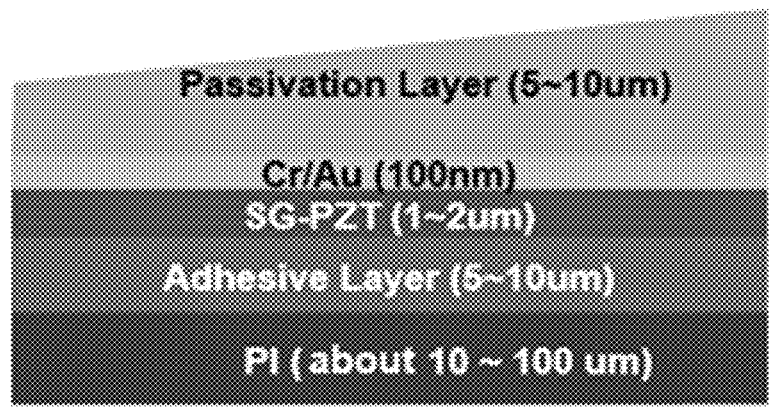
Figure 45:
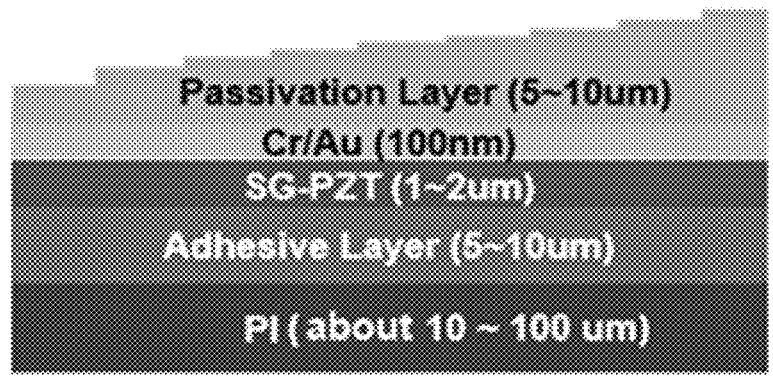

FIGS. 44 and 45 are cross-sectional views of voice sensors with varying sensor thickness by the substrate or the passivation layer respectively.

Referring to FIGS. 44 and 45, the substrate such as polyimide (PI) or the passivation layer positioned below and above the piezoelectric material layer (SG-PZT) and the electrode (Cr—Au) may change in thickness at a predetermined angle in a continuous manner, or may change in thickness stepwise in a discontinuous manner.

As described above, the voice sensor according to the present disclosure includes the plurality of unit channels, and the unit channels are different in at least one of the width or length. That is, at least two of the width, length and thickness of the unit channel electrode are different depending on the voice sensing target frequency range, and in particular, preferably, as the frequency range is lower, the sensor thickness of the unit channel is smaller, and in this instance, preferably, the length is larger.

Figure 46:
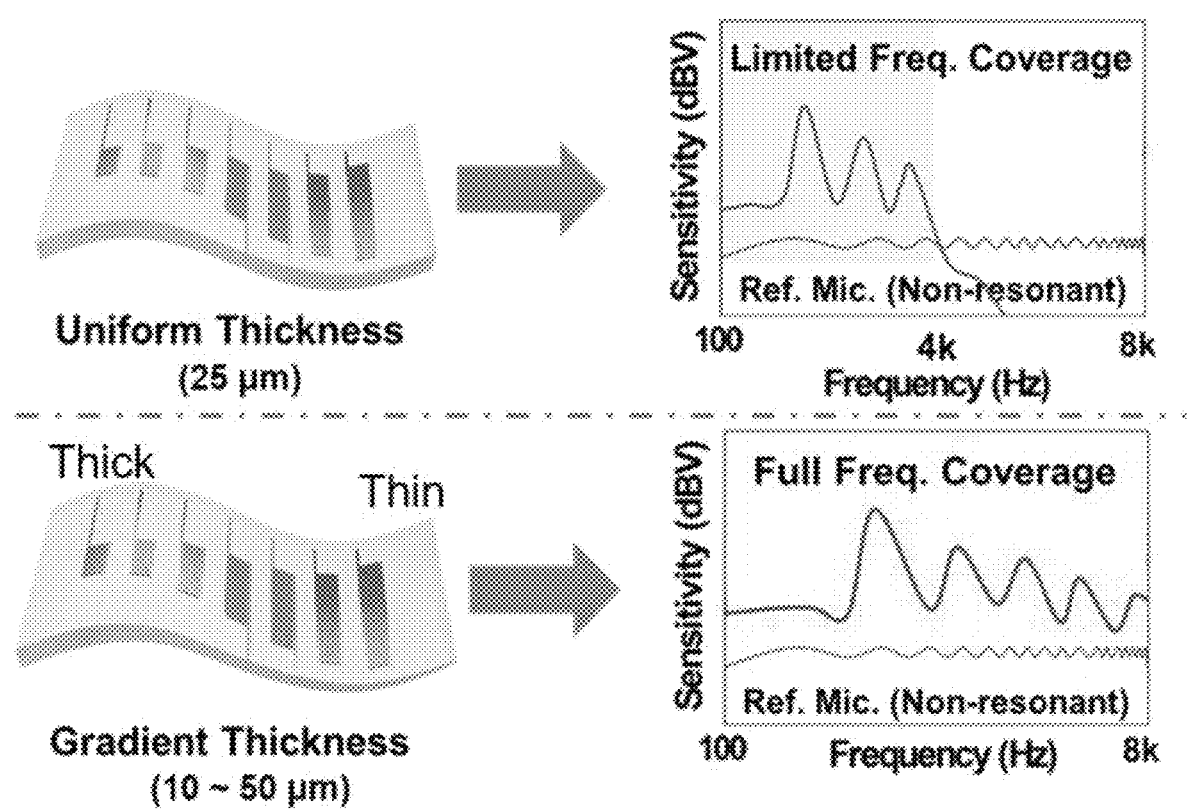
FIG. 46 shows comparison results of frequency range of a sensor having a combination of different sensor thickness and length.

FIG. 46 shows the comparison results of frequency range of the sensor having a combination of different sensor thickness and length.

Referring to FIG. 46, in the same number of channels and the same channel size, the frequency range of the voice sensor having the same thickness of 25 µm is at the level of 100 to 4000 Hz, while the frequency range of the voice sensor having different thickness of 10 to 50 µm is expanded to the level of 100 to 8000 Hz. That is, in particular, the voice sensor according to the present disclosure is different in the length of the channel defined as a combination of piezoelectric material layer-electrode and the thickness of the voice sensor in the corresponding channel, thereby sensing the wider range of frequencies.

Figure 47:
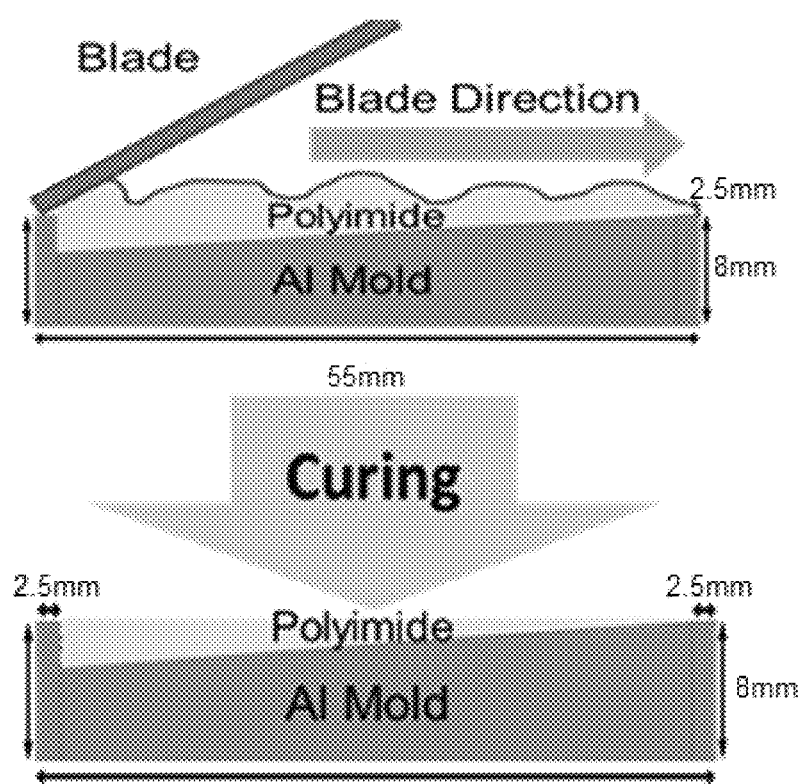
FIG. 47 is a diagram illustrating a method for fabricating a substrate (polyimide (PI)) of a voice sensor device having a continuous change in thickness according to an embodiment of the present disclosure.

FIG. 47 is a diagram illustrating a method for fabricating the substrate (polyimide (PI)) of the voice sensor device having a continuous change in thickness according to an embodiment of the present disclosure.

Referring to FIG. 47, an inclined substrate is fabricated by applying polyimide in an inclined aluminum mold, debubbling, and curing it.

Figure 48:
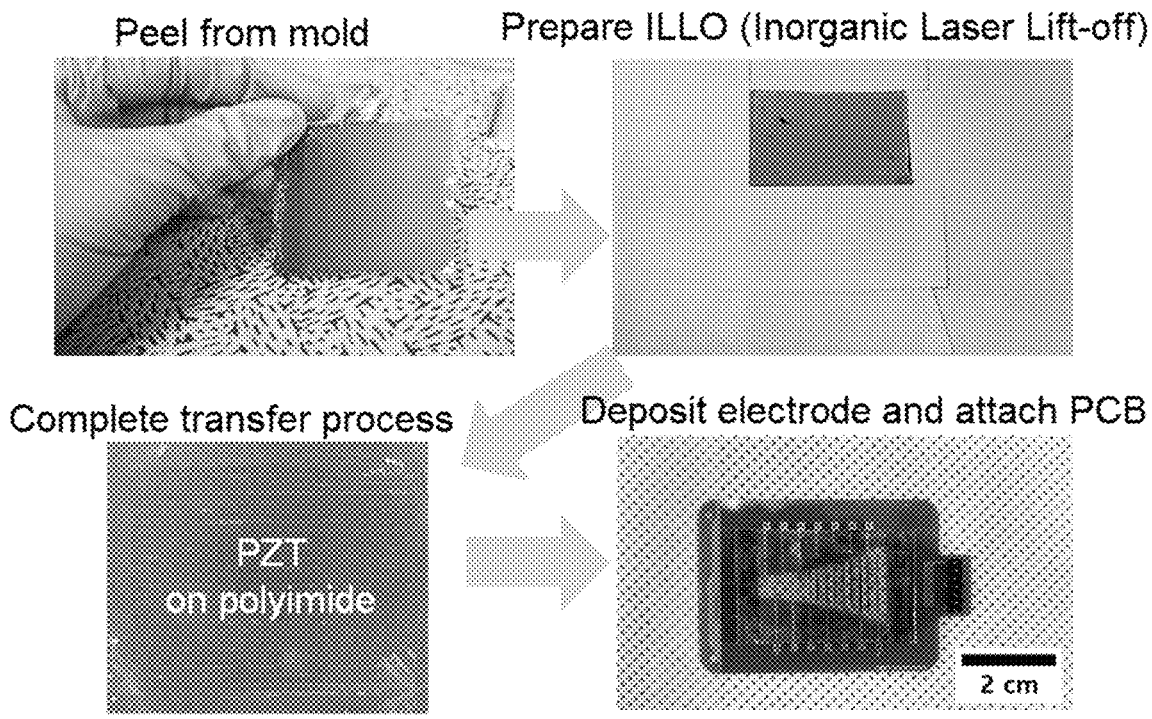
FIG. 48 is a photographic image of a method for fabricating a voice sensor according to an embodiment of the present disclosure using the fabricated substrate.

FIG. 48 is a photographic image of a method for fabricating the voice sensor according to an embodiment of the present disclosure using the fabricated substrate. The fabrication method is as below.

First, a PZT thin film which is a piezoelectric material layer, is deposited on a sapphire substrate which is a sacrificial substrate through a sol-gel process well known in the art, and to remove organics from the sol-gel solution thin film, 0.4 M PZT sol-gel solution (Zr:Ti at a mole ratio of 52:48 having more than 10 mol % of PbO) is spin-cast on a wafer, and a pyrolysis process in an air atmosphere of 450° C. is performed for 10 min.

The deposition and pyrolysis step is performed repeatedly multiple times to form a 1 µm thick PZT thin film, and crystallization of the PZT thin film is performed in air at 650° C. for 45 min. In this instance, for the pyrolysis and crystallization process, rapid thermal annealing (RTA) may be used. Subsequently, the above-described polyimide substrate of different thickness is attached to the PZT thin film deposited on the sapphire substrate.

Subsequently, an inorganic laser lift off (ILLO) process is used to separate the sapphire substrate from the PZT thin film. That is, irradiation on the backside of the sapphire substrate 100 through XeCl-pulse excimer laser to separate the sapphire substrate 100 from the PZT thin film 300 makes it possible to move the PZT thin film to a flexible plastic substrate due to, for example, the photon energy (4.03 eV) of XeCl laser that is lower than the band-gap energy of the sapphire substrate and higher than that of the PZT thin film. As a result, the laser beam passes through the sapphire substrate, and subsequently, local melting and dissolution of PZT occurs at the boundary with the sapphire substrate. As described above, a laser lift off (LLO) process for converting the PZT thin film into the plastic substrate takes place.

Subsequently, an electrode is stacked on the PZT thin film which is a piezoelectric material layer formed on the substrate having different thickness, and accordingly, the polyimide substrate, the PZT thin film and the electrode having different thickness are stacked from the bottom, to fabricate the piezoelectric device. Here, the electrode forms a plurality of frequency separation channels.

Figure 49:
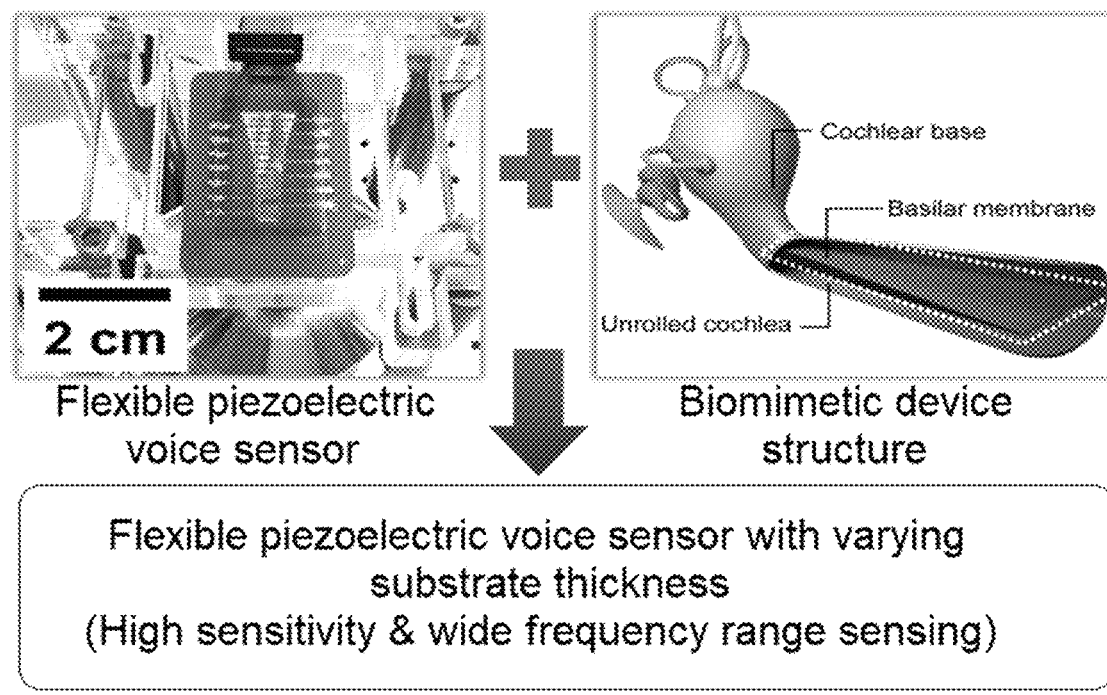
FIG. 49 shows the structural characteristics of high sensitivity and wide frequency range sensing through a flexible piezoelectric voice sensor having a change in substrate thickness according to the present disclosure.
Figure 50:
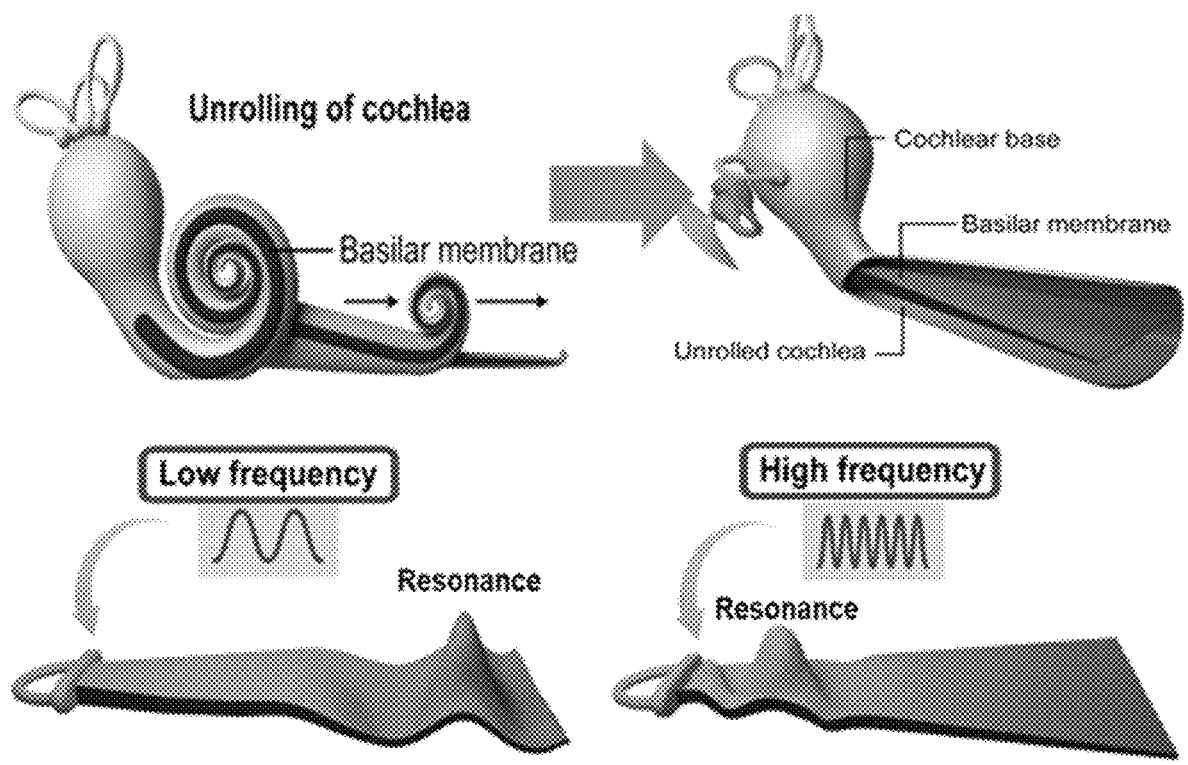
FIG. 50 shows that the thickness reduces with the increasing channel length at low frequency range, and the thickness increases with the reducing channel length at high frequency range.
Figure 51:
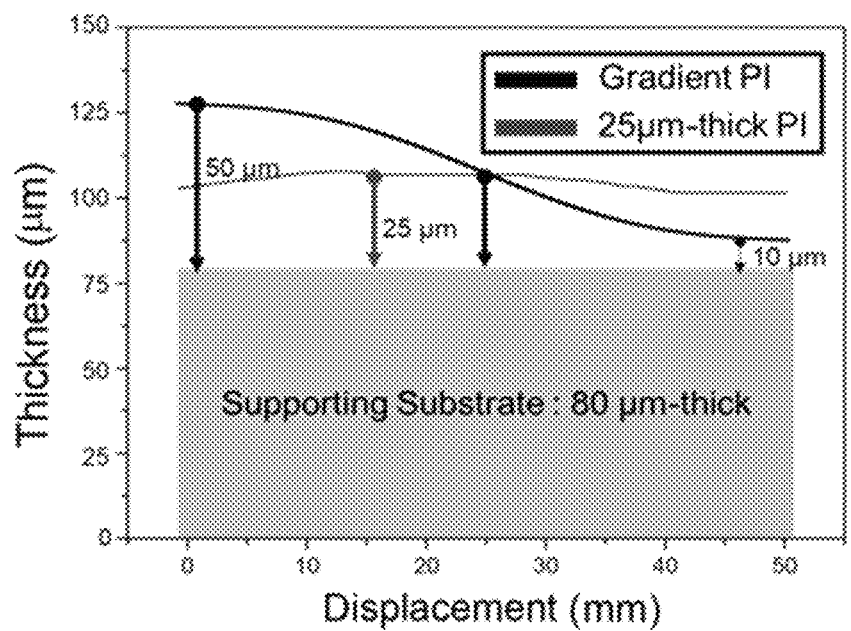
FIG. 51 shows an average thickness of a Gradient PI sample and a PI substrate having a uniform thickness of 25 μm.
Figure 52:
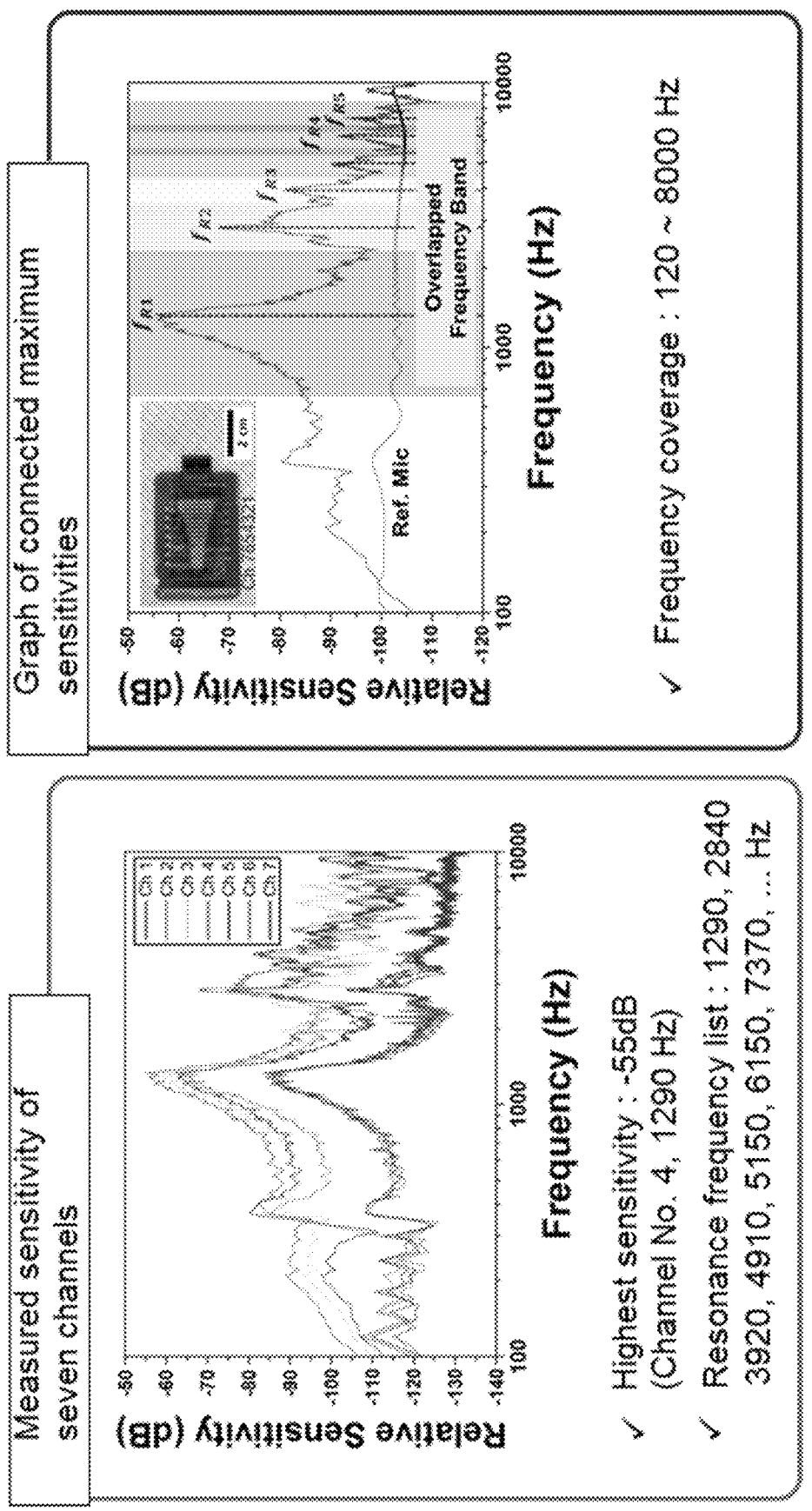
FIG. 52 shows a sensitivity output value that is an electrical property of a voice sensor device according to the present disclosure.
Figure 53:
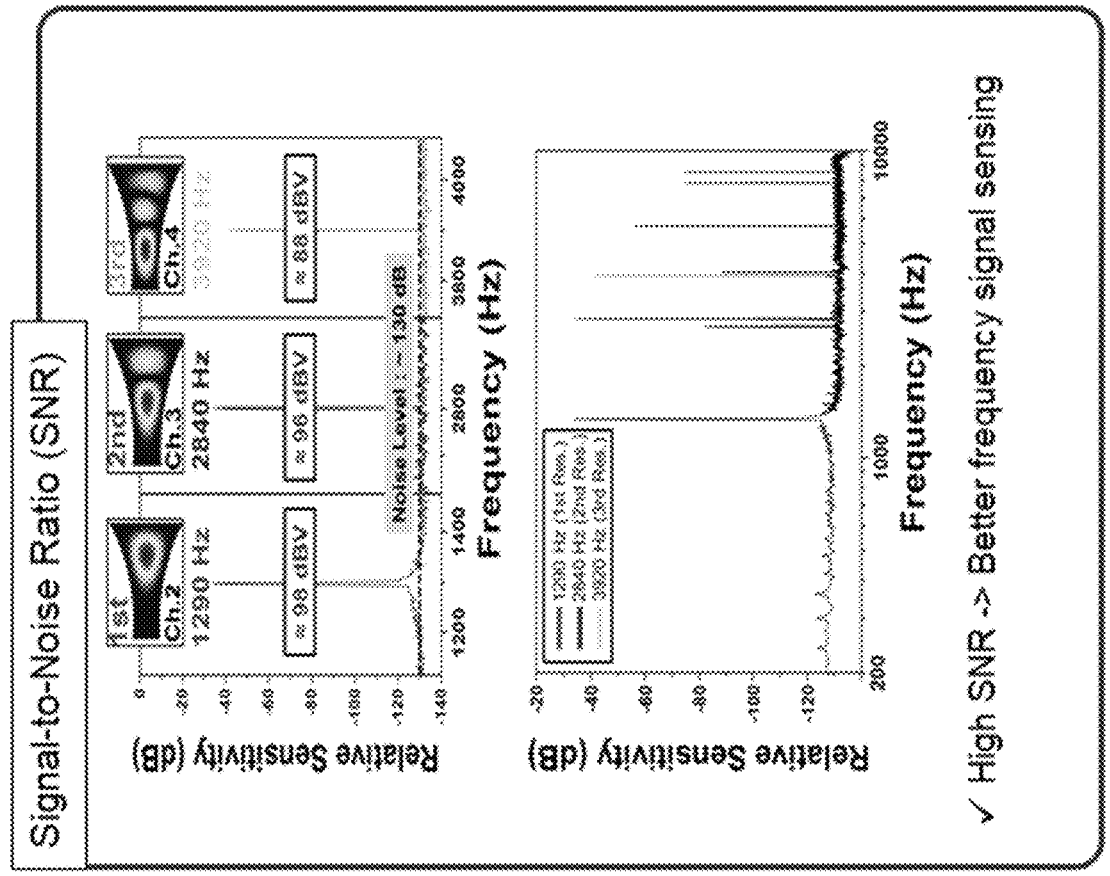
FIG. 53 shows voltage measurement results at resonance frequency of a voice signal.
Figure 53:
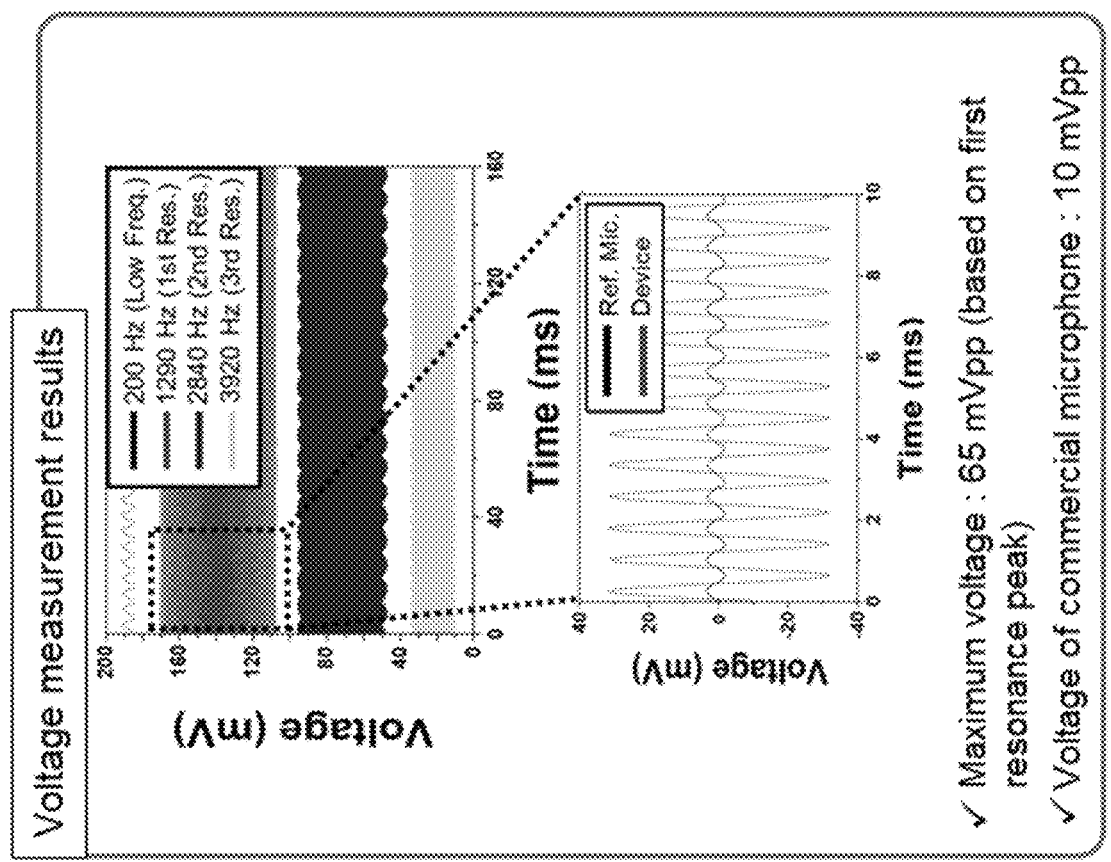
Figure 54:
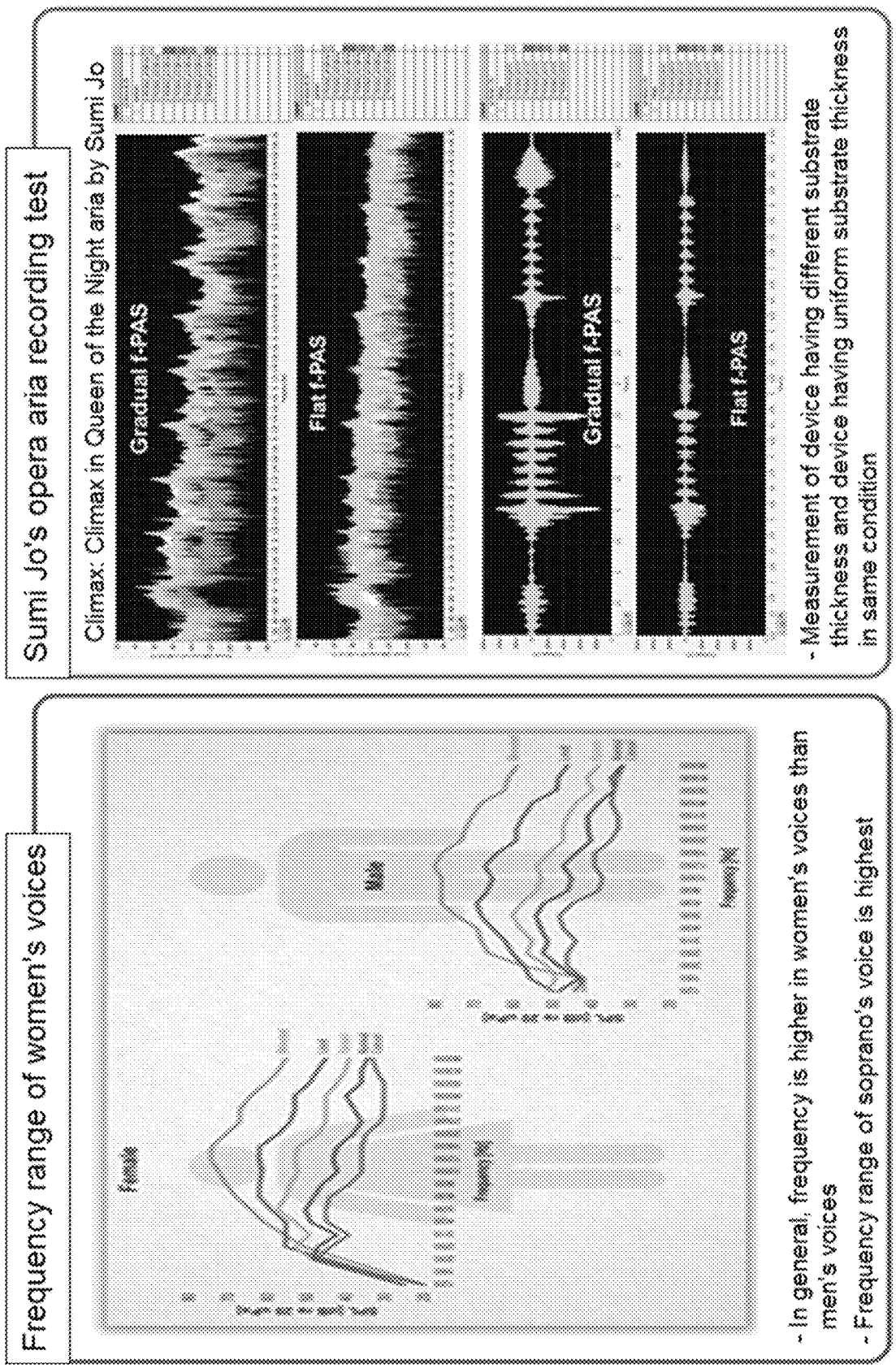
FIGS. 54 and 55 show voice recognition test results at high frequency.
Figure 55:
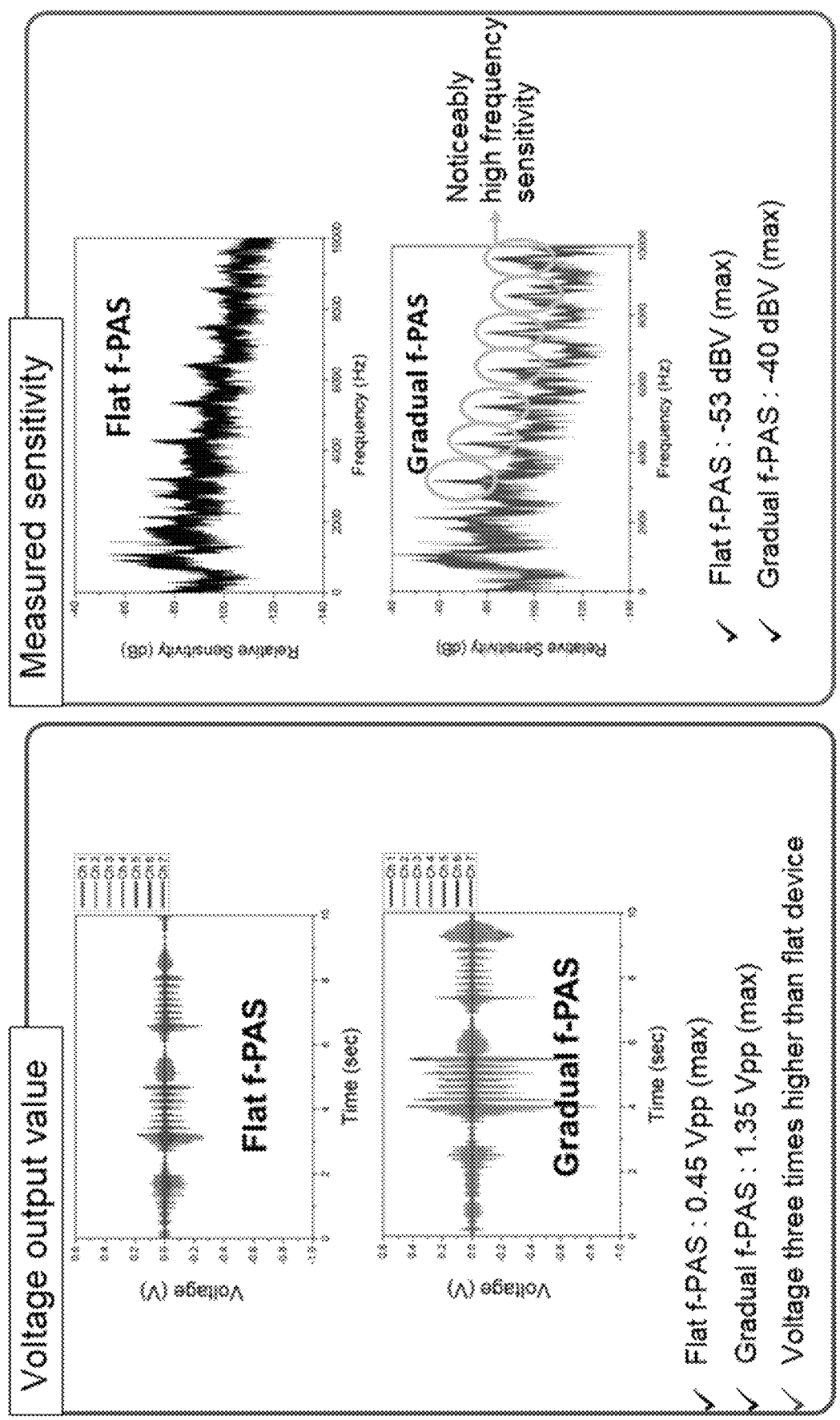

FIG. 49. Previous Flat Flexible Piezoelectric Acoustic Sensors (Flat F-PAS) depicting the human basal membrane did not mimic thickness changes. The human basal membrane has a resonant frequency from 20 to 20000 Hz using variations in width and thickness. Therefore, a Flexible Piezoelectric Acoustic Sensor was produced using a polymer substrate with varying thickness instead of a conventional polymer substrate with constant thickness. This allows for higher sensitivity and wider frequency range sensing.

The present disclosure of the voice sensor having different thickness is designed to recognize voice by mimicking the cochlea, the human organ of hearing, and does not use the existing combination method of microphone, ADC and DSP for frequency separation, and instead uses a simple circuit based on a flexible piezoelectric voice sensor, thereby significantly reducing the power consumption. Additionally, implementation of a compatible efficient recognition algorithm achieves human's natural language recognition with high selectivity, sensitivity, sensing rate and stability.

The technologies of the present disclosure can be applied to daily life, and for example, it is possible to use an automobile information system safely in an always-active mode via voice while driving, and through this, it is possible to achieve ultra-low power control for a TV, a cleaner, a washing machine and an air conditioner in the remote distance via human voice. In particular, it is possible to care for disabled people and patients with impaired physical mobility, and voice registration makes it possible to use the facilities, for example, elevators, more conveniently.

This technology is a convergent technology across the fields of IT-NT-BT-materials that is inspired by nature and enriches the human life. It is possible to provide a customized service by understanding the identity, mental and physical health and language skills in an always-active mode with low power through speakers' voices, and it can be used in all sensor applications in the field of security, finance and medical education as well.

In particular, it can be used in mobile healthcare applications, for example, detecting a voice pattern in bigdata and analyzing and storing it, analyzing emotional condition and promoting psychological stability through the feedback system, and it is expected to be helpful for personal information and privacy protection by enhancing security systems through voice authentication and speaker identification.

The present disclosure can implement voice recognition with Internet of Things (IoT) and ultra-miniature voice sensor systems for mobile applications through the above features.

In the present disclosure, the voice recognition sensor made of a high efficiency inorganic piezoelectric material on the flexible substrate splits the mechanical vibration energy from human voice into different locations for each frequency using the piezoelectric material before digital sampling and audio signal processing of the voice spectrum, converts into an electrical signal, and performs parallel voice signal processing for each frequency.

In the present disclosure, as the plurality of frequency separation channels is formed in the shape of an artificial cochlea similar to a xylophone shape and their size is different, high frequency sound and low frequency sound resonate at different locations, thereby physically splitting the human voice. Here, processing of each separated sound includes amplifying through an analog circuit for each frequency, filtering and converting to a digital signal. This process significantly reduces the power consumption, compared to the existing method using the combination of microphone, ADC and DSP.

The present disclosure provides a piezoelectric voice recognition sensor combined on a flexible thin film, which is attached to clothes. That is, it can be applied to technology that harvests the physical energy in acoustic and ultrasonic range easily produced around the clothes to which the sensor is attached and converts into electrical energy.

Generally, to realize the ubiquitous network 'existing anytime and everywhere', the presence of ubiquitous power source 'available anytime and everywhere' is essentially needed. Meanwhile, pervasive ubiquitous network components should have self-sufficient power supply without needing to charge. That is, power generation and accumulation abilities are required.

As described above, the piezoelectric voice recognition sensor according to the present disclosure broadens the frequency range by adopting the structure having the non-uniform substrate thickness with varying substrate thickness.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A voice sensor comprising:
   a substrate;
   a piezoelectric material layer supported on the substrate;
   an electrode positioned above or below the piezoelectric material layer; and
   a polymer layer positioned above or below the piezoelectric material layer, wherein a modulus of the polymer layer ranges from 0.1 to 100 GPa,
   wherein a unit channel is defined as a combination of the piezoelectric material layer and the electrode, and a plurality of unit channels is arranged and separated,
   wherein the voice sensor is fabricated by exposing a part of a thin film including the piezoelectric material layer, the electrode and the polymer layer using etching, and wherein the substrate integrally supports a device layer of the voice sensor.

2. The voice sensor of claim 1, wherein the substrate is a silicon substrate, and the silicon substrate is back-etched through a Bosch process to expose an active area including a sensor area negative piezoelectric layer.

3. The voice sensor of claim 2, wherein the exposed thin film has a width of 0.1 mm to 20 mm.

4. The voice sensor of claim 1, wherein the exposed part of the thin film including the piezoelectric material layer, the electrode and the polymer layer has a circular or polygonal shape.

5. The voice sensor of claim 1, wherein the modulus of the polymer layer is different continuously or discontinuously in a direction within a same layer.

6. The voice sensor of claim 1, wherein the unit channels are different in at least one of width or length.

7. The voice sensor of claim 6, wherein the unit channels are different in length, and the length reduces continuously or discontinuously in a direction.

8. The voice sensor of claim 1, wherein the substrate includes an oxide layer preventing damage of the exposed thin film.

9. The voice sensor of claim 8, wherein the oxide layer acts as an etch stop layer when a thickness is controlled by etching the substrate by an etching method.

10. A voice sensor comprising:
a substrate;
a piezoelectric material layer supported on the substrate;
an electrode positioned above or below the piezoelectric material layer; and
a polymer layer positioned above or below the piezoelectric material layer, wherein a modulus of the polymer layer ranges from 0.1 to 100 GPa,
wherein the voice sensor is fabricated by exposing a part of a thin film including the piezoelectric material layer, the electrode and the polymer layer using etching, and
wherein the substrate integrally supports a device layer of the voice sensor.

11. The voice sensor of claim 10, wherein the substrate is a silicon substrate, and the silicon substrate is back-etched through a Bosch process to expose an active area including a sensor area negative piezoelectric layer.

12. The voice sensor of claim 11, wherein the exposed thin film has a width of 0.1 mm to 20 mm.

13. The voice sensor of claim 10, wherein the exposed part of the thin film including the piezoelectric material layer, the electrode and the polymer layer has a circular or polygonal shape.

14. The voice sensor of claim 10, wherein the modulus of the polymer layer is different continuously or discontinuously in a direction within a same layer.

15. The voice sensor of claim 10, wherein the substrate includes an oxide layer preventing damage of the exposed thin film.

16. The voice sensor of claim 15, wherein the oxide layer acts as an etch stop layer when a thickness is controlled by etching the substrate by an etching method.

* * * * *